United States Patent
Feight et al.

(10) Patent No.: US 6,949,921 B1
(45) Date of Patent: Sep. 27, 2005

(54) AUTO-CALIBRATION OF MULTIPLE TRIP SETTINGS IN A FAULT INDICATOR

(75) Inventors: Laurence V. Feight, Island Lake, IL (US); Kurt J. Fenske, Gleason, WI (US)

(73) Assignee: E.O. Schweitzer Manufacturing Co., LLC, Mundelein, IL (US)

( * ) Notice: Subject to any disclaimer, the term of this patent is extended or adjusted under 35 U.S.C. 154(b) by 208 days.

(21) Appl. No.: 10/454,847

(22) Filed: Jun. 4, 2003

Related U.S. Application Data

(63) Continuation-in-part of application No. 10/280,322, filed on Oct. 25, 2002, and application No. 10/280,219, filed on Oct. 25, 2002, now Pat. No. 6,734,662, and application No. 10/280,141, filed on Oct. 25, 2002, and application No. 10/280,329, filed on Oct. 25, 2002, and application No. 10/280,195, filed on Oct. 25, 2002, and application No. 10/280,328, filed on Oct. 25, 2002, now Pat. No. 6,822,576

(60) Provisional application No. 60/384,608, filed on May 31, 2002, provisional application No. 60/339,574, filed on Oct. 26, 2001, provisional application No. 60/339,412, filed on Oct. 26, 2001, provisional application No. 60/339,256, filed on Oct. 26, 2001, provisional application No. 60/337,632, filed on Oct. 26, 2001, provisional application No. 60/337,631, filed on Oct. 26, 2001, and provisional application No. 60/337,438, filed on Oct. 26, 2001.

(51) Int. Cl.[7] .............................................. G01R 19/14
(52) U.S. Cl. ........................ 324/127; 324/126; 324/133
(58) Field of Search ................................. 324/126–127, 324/509, 536, 133, 158.1; 340/660–664

(56) References Cited

U.S. PATENT DOCUMENTS

| | | | |
|---|---|---|---|
| 3,816,816 A | * | 6/1974 | Schweitzer, Jr. ............ 324/133 |
| 4,063,171 A | | 12/1977 | Schweitzer, Jr. |
| 4,234,847 A | | 11/1980 | Schweitzer |
| 4,438,403 A | | 3/1984 | Schweitzer, Jr. |
| 4,456,873 A | | 6/1984 | Schweitzer, Jr. |
| 4,495,489 A | | 1/1985 | Schweitzer, Jr. |
| 4,788,619 A | | 11/1988 | Ott et al. |
| 4,904,932 A | | 2/1990 | Schweitzer, Jr. |
| 5,677,678 A | | 10/1997 | Schweitzer, Jr. |
| 6,016,105 A | | 1/2000 | Schweitzer, Jr. |
| 6,133,723 A | | 10/2000 | Feight |
| 6,133,724 A | | 10/2000 | Schweitzer, Jr. et al. |
| 6,362,628 B2 | * | 3/2002 | Macbeth et al. ............ 324/536 |
| 6,472,882 B1 | * | 10/2002 | Tiemann et al. ............ 324/509 |
| 6,734,662 B1 | * | 5/2004 | Fenske ....................... 324/127 |

* cited by examiner

Primary Examiner—Vinh P. Nguyen
(74) Attorney, Agent, or Firm—Cook, Alex, McFarron, Manzo, Cummings & Mehler, Ltd.

(57) ABSTRACT

A fault indicator for indicating the occurrence of a fault in an electrical conductor has a plurality of trip settings, such as in the range of 50 A to 1200 A, that is automatically calibrated. The fault indicator includes a housing, a battery, an illuminated display, such as LEDs, a current sensor for sensing the load current in the conductor and a microcontroller that receives a current signal from the current sensor to determine the load current. In the calibration mode, a known load current is passed through the conductor, the microcontroller selects the trip level that is related to the load current, determines the load current from the current signal, and sequentially calibrates each of the plurality of trip levels for the respective known load currents. The calibration information is stored in memory. The illuminated display provides a distinctive pattern to indicate that each trip setting has been calibrated.

16 Claims, 24 Drawing Sheets

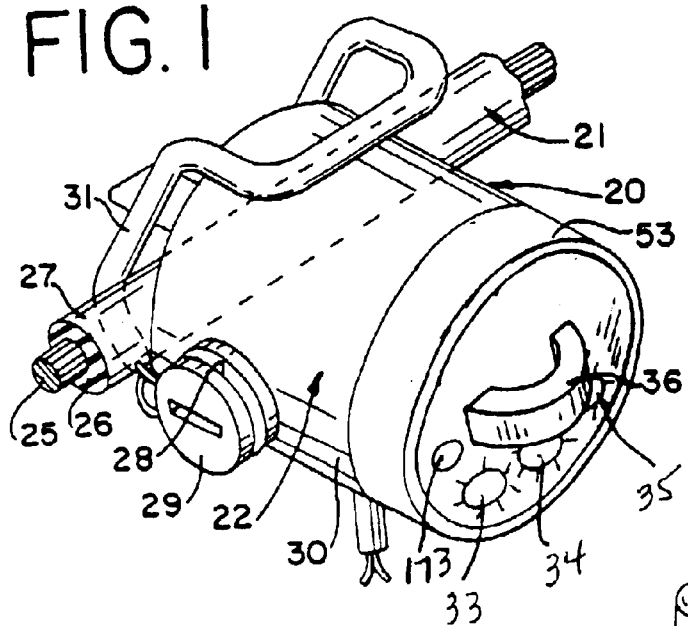
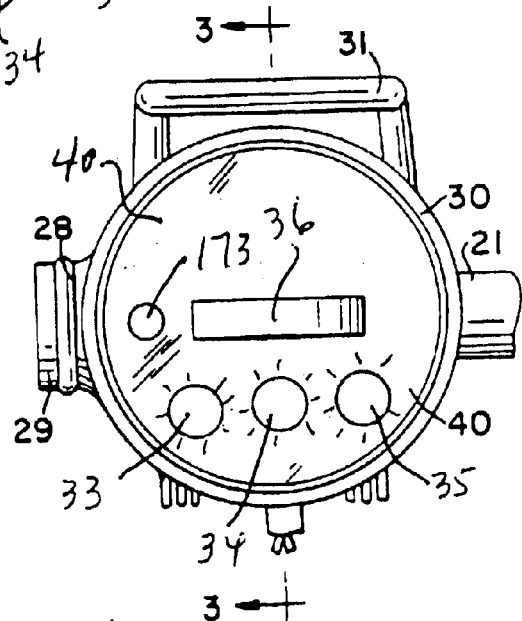
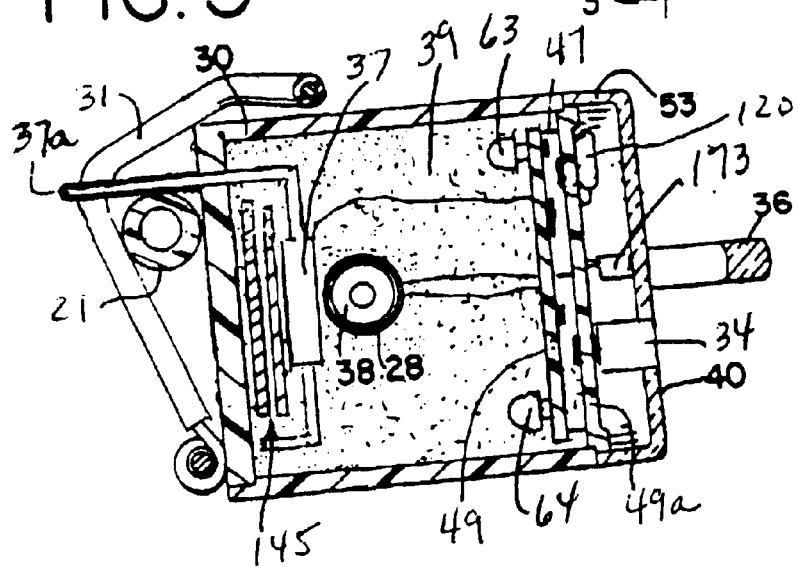

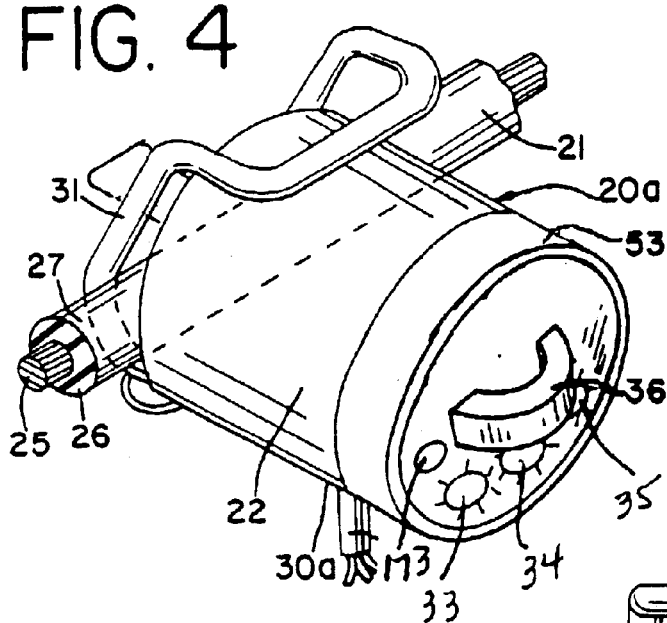
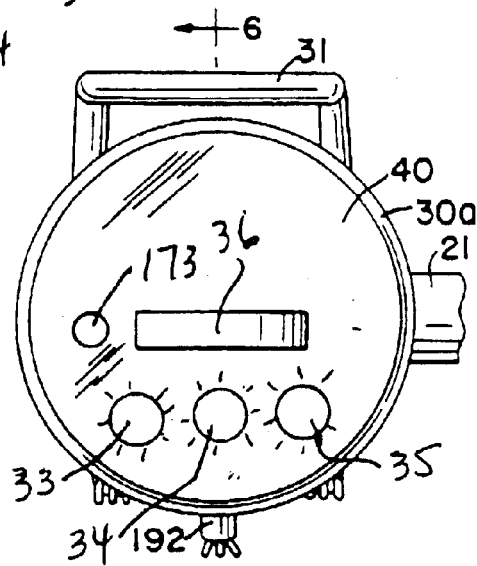
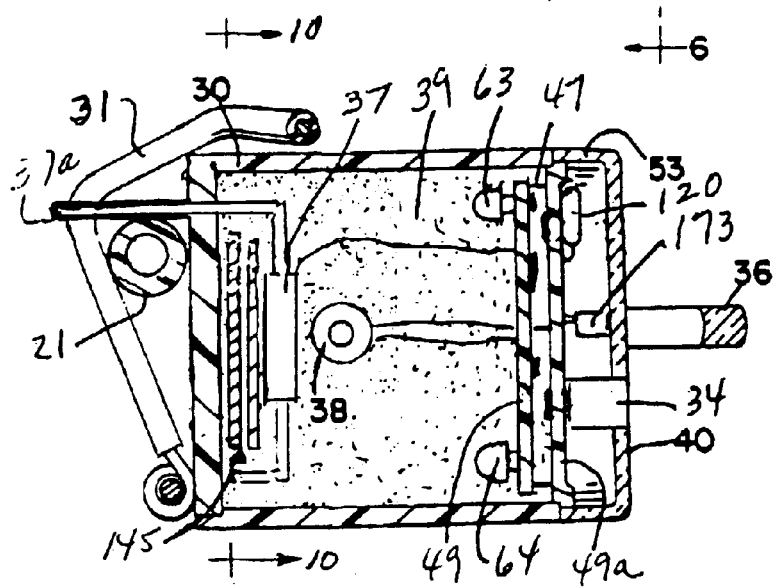

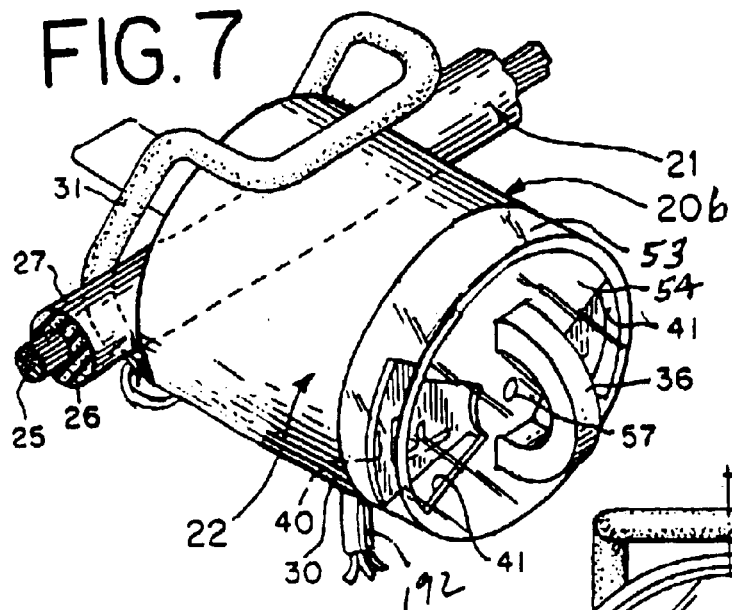
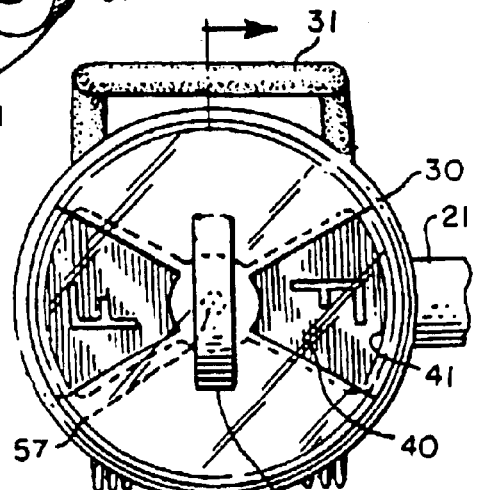
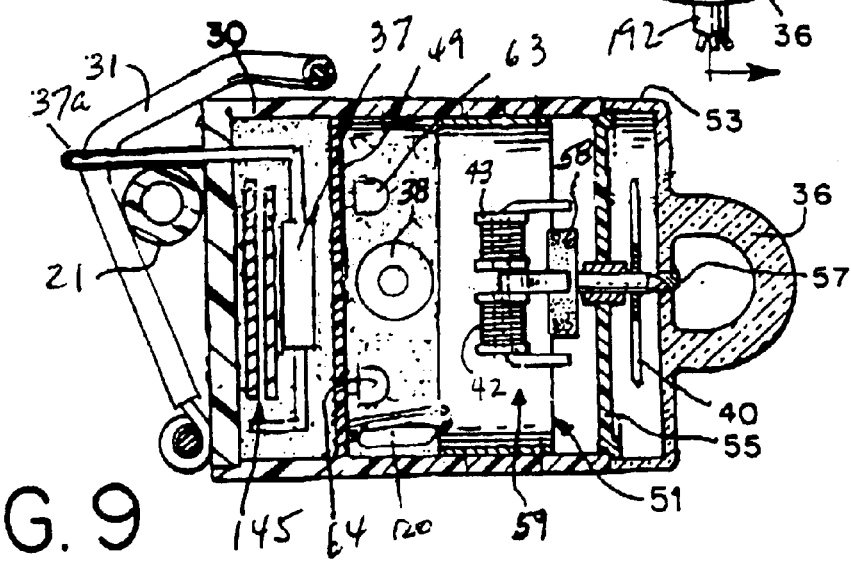

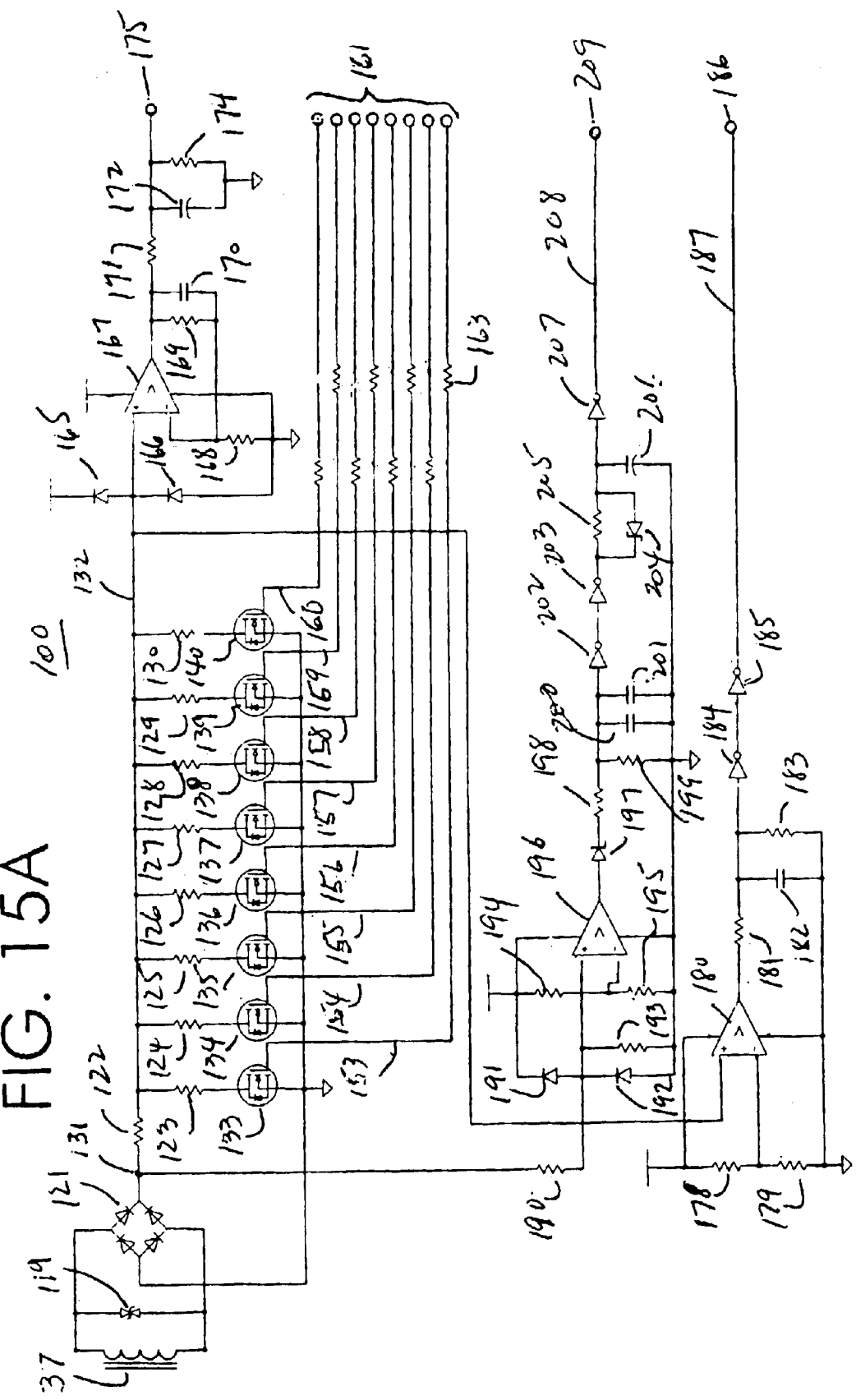

AUTO-CALIBRATION OF MULTIPLE TRIP SETTINGS IN A FAULT INDICATOR

CROSS-REFERENCE TO RELATED APPLICATIONS

This patent application is a continuation-in-part patent application of the following non-provisional patent applications: Microprocessor Controlled Fault Indicator with Battery Conservation Mode, Ser. No. 10/280,322, filed on Oct. 25, 2002; claims benefit of Provisional Appl. 60/339,412, filed on Oct. 26, 2001; Miroprocessor Fault Indicator Having LED Fault Indication Circuit with Battery Conservation Mode, Ser. No. 10/280,219, filed on Oct. 25, 2002 now U.S. Pat. No. 6,734,662, claims benefit of Provisional Appl. Ser. No. 60/337,631, filed Oct. 26, 2001; Microprocessor Fault Indicator Having High Visibility LED Fault Indication, Ser. No. 10/280,141, filed on Oct. 25, 2002; claims benefit of Provisional Application 60/339,256, filed on Oct. 26, 2001; Microprocessor Controlled Fault Indicator Having Inrush Restraint Circuit, Ser. No. 10/280,329, filed on Oct. 25, 2002; claims benefit of Provisional Appl. 60,337,438, filed Oct. 26, 2001; Microprocessor Controlled Directional Fault Indicator, Ser. No. 10/280,195, filed on Oct. 25, 2002; claims benefit of Provisional Appl. 60/339,574, filed on Oct. 26, 2001; Microprocessor Controlled Fault Indicator with Circuit Overload Condition Detection, Ser. No. 10/280,328, filed on Oct. 25, 2002; now U.S. Pat. No. 6,822,576, claims benefit of Provisional Appl. 60/337,632, filed Oct. 26, 2001 and of the following provisional patent application: Targeted Timed Reset Fault Indicator, Ser. No. 60/384,608, filed on May 31, 2002; all of which are incorporated herein by reference in their entireties; and the rights of priority of which are all hereby claimed for this application.

BACKGROUND OF THE INVENTION

The present invention relates generally to current sensing devices for electrical systems, and more particularly to timed reset fault indicators for alternating current power systems with multiple trip settings that are configured.

Various types of self-powered fault indicators have been constructed for detecting electrical faults in power distribution systems, including clamp-on type fault indicators, which clamp directly over cables in the systems and derive their operating power from inductive and/or capacitive coupling to the monitored conductor; and test point type fault indicators, which are mounted over test points on cables or associated connectors of the systems and derive their operating power from capacitive coupling to the monitored conductor.

Such fault indicators may be either of the manually resetting type, wherein it is necessary that the indicators be physically reset, or of the self-resetting type, wherein the indicators are reset upon restoration of line current. Examples of such fault indicators are found in products manufactured by E. O. Schweitzer Manufacturing Company of Mundelein, Ill., and in U.S. Pat. Nos. 3,676,740, 3,906,477, 4,063,171, 4,234,847, 4,375,617, 4,438,403, 4,956,873, 4,458,198, 4,495,489, 4,974,329, 5,677,678, 6,016,105, 6,133,723 and 6,133,724.

Detection of fault currents in a monitored conductor by a fault indicator is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the fault indicator may be manually reset. Some prior art fault indicators also utilize light emitting diodes (LEDs) to display a fault condition.

Such prior art fault indicators have a single trip setting. This means that a plurality of different fault indicators need to be manufactured, inventoried and sold to meet customers' requirements for fault indicators with 25 ampere (A), 50 A, 10 A, 200 A, 400 A, 600 A, 800 A, 1000 A, 1200 A and 2500 A trip settings to monitor conductors that carry correspondingly different load currents.

There is therefore a need for a fault indicator with multiple trip settings that can determine the present load current level in a monitored conductor and select one of the trip settings that is appropriate for present load current conditions on the monitored conductor.

A need also exists for methods or techniques to configure the multiple trip settings of such a fault indicator.

Because of the compact construction and limited power available in self-powered fault indicators, it is preferable that the desired functions of the fault indicator be accomplished with minimal structure and with internal circuitry that has minimal current drain on a high capacity battery. The fault indicator must also provide highly reliable and extended operation over a number of years.

Accordingly, it is a general object of the present invention to provide a new and improved fault indicator that automatically selects one of a plurality of configured trip settings that is related to the load current in the monitored conductor.

Another object of the present invention is to provide a fault indicator that is capable of operating over a broad range of load currents, such as from about 5 A to about 1200 A.

Yet another object of the present invention is to provide a means of configuring each of the multiple trip settings of such a fault indicator.

Another object of the present invention is to provide a fault indicator that is microprocessor controlled, with the selection of the multiple configured trip settings under microcontroller control.

A further object of the present invention is to provide a fault indicator with a microcontroller that assists in the configuration of the multiple trip settings.

SUMMARY OF THE INVENTION

This invention is directed to a fault indicator for indicating the occurrence of a fault current in an electrical conductor. The fault indicator has a housing, a battery, a display for indicating that a fault in a monitored conductor has occurred, a current sensor for sensing the load current in the monitored conductor and for providing a load current signal that is related to the load current, and a microcontroller that receives the load current signal, that determines the load current in the monitored conductor, that selects one of a plurality of trip settings based upon the load current and that determines that a fault condition has occurred when the load current exceeds the trip setting. For example, the fault indicator may have selectable trip settings of 25 A, 50 A, 100 A, 200 A, 400 A, 600 A, 800 A, 1000 A, 1200 A and 2500 A, or any subset thereof.

Memory, such as flash memory, is preferably available for the microcontroller to store and to recall information, such as the selected trip setting, whether a fault is a permanent fault or a temporary fault, the time remaining before a timed reset will occur, the ambient lighting conditions, whether the fault indicator is configured for an overhead application or an underground application, and the like. Such memory may be available internally in the microcontroller.

If the load current exceeds the previously configured trip setting, the microcontroller activates the display in the permanent fault mode for a predetermined period, such as about one minute, when it again samples the load current in the monitored conductor. If the load current is below about 5 A, the microcontroller continues to activate the permanent fault display. If the load current is above 5 A but below the trip setting, the microcontroller activates a temporary fault display. If the load current remains above the trip setting, the load current has increased and the microcontroller reconfigures the trip setting at a higher setting that is related to the increased load current.

The display may include a plurality of LEDs to display permanent and temporary fault conditions and LEDs disposed within the housing to make the housing glow or flash in the nighttime. For example, the display may have two LEDs of a first color, such as red, to display a permanent fault condition and a LED of a second color, such as yellow, to display a temporary fault condition. The LEDs are preferably pulsed at periodic intervals to conserve battery power, and the power supplied to the LEDs is further reduced under nighttime conditions. The display may optionally be of the targeted type.

The fault indicator also automatically configures itself for overhead or underground applications. In an overhead application, an electromagnetic field exists about the monitored conductor. An electromagnetic sensor develops a voltage signal from the electromagnetic field, which is translated as a logic signal input to the microcontroller. If the microcontroller determines that the logic input represents the presence of an electromagnetic field, the fault indicator is configured for an overhead application, such as by setting the trip response within a range of 1 to 50 ms, and preferably about 24 ms, using the voltage inrush detection and/or current inrush detection, enabling a photo-sensor to distinguish between daytime and nighttime illumination conditions, and powering the display LEDs in a higher power-daytime mode or in a lower power nighttime mode.

If an insufficient electromagnetic field is sensed by the electromagnetic sensor, the logic signal from the sensor to the microcontroller will indicate that the fault indicator should be configured for an underground application, such as by setting the trip response within a range of about 1 to 24 ms, and preferably about 1 ms, using current inrush detection, disabling the photo-sensor, and powering the display LEDs in the lower power nighttime mode. The microcontroller may also use one LED to indicate a permanent fault condition in the underground configuration, instead of two LEDs as in the overhead configuration. In addition, the LED in the underground application may be powered only in the lower power mode.

In accordance with a primary aspect of the present invention, the fault indicator automatically calibrates itself for each of the plurality of trip settings when in a calibration mode. The microcontroller, when in the auto-calibration mode, checks the input signal from the current sensor for each of the trip settings and calibrates each trip setting, which may then be stored in memory. The calibration information for each trip setting is stored in memory. After calibration of each trip setting, the microcontroller will confirm that the trip setting is calibrated by flashing one of the LEDs once for the lowest or first setting, twice for the next or second setting, and so forth, until calibration of all of the trip settings are confirmed.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures in which like reference numerals identify like elements, and in which:

FIG. 1 is a perspective view of an electric field powered clamp-on fault indicator with provision for external battery replacement that is constructed in accordance with the present invention and that may be installed on a cable within a power distribution system.

FIG. 2 is a front view of the fault indicator of FIG. 1 showing illuminated LEDs to indicate the occurrence of a fault.

FIG. 3 is a cross-sectional view of the fault indicator of FIGS. 1 and 2 taken along the sectional line 3—3 of FIG. 2.

FIG. 4 is a perspective view of an alternate embodiment of the electric field powered fault indicator shown in FIGS. 1–3, with an internal non-replaceable battery, constructed in accordance with the present invention and installed on a cable within a power distribution system.

FIG. 5 is a front view of the fault indicator of FIG. 4 showing illuminated LEDs to indicate the occurrence of a fault.

FIG. 6 is a cross-sectional view of the fault indicator of FIGS. 4 and 5 taken along the section line 6—6 of FIG. 5.

FIG. 7 is a perspective view of an electric field powered clamp-on fault indicator of the targeted type that is also equipped with one or more internal LEDs and an internal battery that is constructed in accordance with the present invention and that may be installed on a cable within a power distribution system.

FIG. 8 is a front view of the targeted fault indicator of FIG. 7.

FIG. 9 is a cross-sectional view of the fault indicator of FIGS. 7 and 8 taken along the sectional line 9—9 of FIG. 8.

FIGS. 15A and 15B together constitute an electrical schematic diagram of the electronic circuitry for the fault indicators shown in FIGS. 1–6.

DESCRIPTION OF THE PREFERRED EMBODIMENT

Figure 10:
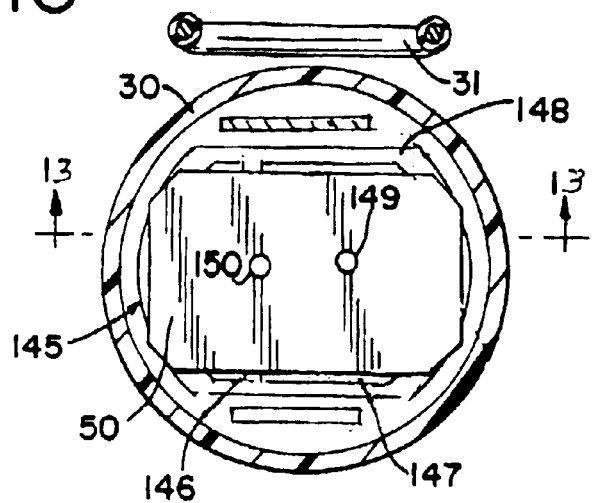
FIG. 10 is a cross-sectional view of the fault indicator of FIGS. 4–6 taken along the section line 10—10 of FIG. 6 to better illustrate an electrostatic pickup for deriving power from the electromagnetic field around the conductor of the power distribution system, and to supply operating power to portions of the electronic circuitry in the fault indicators shown in FIGS. 1–9.

Referring to the Figures, and particularly to FIG. 1, a clamp-on timed reset fault indicator, generally designated 20, is constructed in accordance with the invention. Fault indicator 20 indicates fault currents in an electrical feeder or distribution cable, generally designated 21, and includes a circuit module, generally designated 22. Cable 21 may be part of an overhead electrical distribution system or of an underground distribution system, such as where the cable comes up from the ground at a pad-mounted transformer. In accordance with conventional practice, circuit module 22 is attached to the outer surface of the cable 21, which may include a central conductor 25, a concentric insulating layer 26 and an electrically grounded rubber outer sheath 27.

Circuit module 22 includes a housing 30 (FIG. 2) that contains electronic circuitry for sensing and responding to fault currents in cable 21. A current transformer 37 is located within housing 30 and has a pole piece 37a that extends through housing 30 in an orientation that is generally perpendicular to the rear face of housing 30. The exterior portion of pole piece 37a may be coated with an insulative material or may have an insulating sleeve disposed thereon. A clamp assembly 31 attaches the module to a monitored conductor, such as cable 21, and holds cable 21 in close proximity to the pole piece 37a of current transformer 37. Clamp assembly 31 is designed to accommodate a range of cables 21 having different diameters. Current transformer 37 senses the load current in conductor 21 and provides a signal representative of the load current to electronic circuitry 100, which is discussed below. An electrostatic sensor 145 is disposed between current transformer 37 and the rear wall of housing 30. Sensor 145 senses the electromagnetic field about conductor 21 and likewise provides a signal representative of the electromagnetic field to electronic circuitry 100. Sensor 145 is also discussed below, including details on the construction and operation of the electrostatic sensor.

An eye 36 on an end cap 53 of the housing may be provided to allow use of a conventional hotstick during installation or removal of fault indicator 20 about cable 21. When installed on an overhead cable, fault indicator 21 normally hangs downwardly such that a face 40 containing the status indicators, such as LEDs 33–35, are easily viewed from the ground by service personnel or the like.

Housing 30 and end cap 53 may be formed from any suitable material, such as plastic. End cap 53 forms part of the housing 30, and may be sonically welded to housing 30 to seal the interior of fault indicator 20 against contamination. A battery holder 28 within housing 30 includes a removable end cap 29, which provides access to a cylindrical battery compartment within which a battery 38 (FIG. 3) is contained. In this example, battery 38 may be one or more type AA lithium thionyl chloride cells that have about 2.4 ampere-hours of capacity and that are commercially available from Tadiran, Ltd. of Israel.

Circuit module 22 also includes status indicators, such as three LEDs 33–35, to indicate whether a fault has occurred on cable 21. In operation, during normal current flow through conductor 21, LEDs 33–35 are normally off and not illuminated. Upon occurrence of a fault in a monitored conductor, LEDs 33 and 35 are illuminated by electronic circuitry, which is discussed in further detail below, to indicate that a permanent fault has occurred. If it is determined by the circuitry that the fault was a temporary fault, LED 34 will be illuminated. For best viewing from different angles of view, LEDs 33–35 are nearly flush with the exterior surface of end cap 53. If desired, LEDs 33–35 may project slightly above the top surface 40 of the end cap 53, or end cap 53 may be provided with convex lenses (not shown) to provide illumination in about a 280° field of view for better viewing by service personnel. LEDs 33–35 may be selected from any color commercially available. Preferably, LEDs 33 and 35 are of a different color than LED 34, such as red for permanent fault indicating LEDs 33 and 35, and yellow for temporary fault indicating LED 34. End cap 53 is preferably of a contrasting color to LEDs 33–35, such as dark blue, for better visibility of the LEDs.

A light sensor 173 may be disposed on the face 40 of fault indicator 20 to sense ambient light levels. As further discussed below, light sensor 173 may influence the intensity of light provided by LEDs 33–35 under differing ambient light conditions. With reference to FIG. 3, a pair of circuit boards 49 and 49a are disposed in the housing 30 near the face end thereof. These circuit boards contain most of the electronic circuitry 100, which is presented in greater detail below. The circuit boards 49 and 49a are spaced apart with most of the circuitry disposed between the two circuit boards 49, 49a. A plurality of ground pins 47 disposed about the periphery of the circuit boards interconnect the ground planes in the circuit boards and, in combination with the circuit boards, provide a simulated Faraday cage to provide the circuitry with electromagnetic isolation to stray electromagnetic disturbances or the like. Circuit board 49a also supports LEDs 33–35, ambient light sensor 173, a magnetic reset switch 120 and various other components.

A pigtail 192 may provide signals relating to the operational status of fault indicator 20, such as to a remote location, for remotely monitoring the electrical distribution system or for automation purposes.

Additional LEDs 63–64 may be disposed internally in housing 30, such as in the potting compound 39 that encases most of the electronic circuitry. It may be desirable to use two interior LEDs 63–64 because certain other internal components, such as battery 38, may block a substantial portion of the illumination at certain viewing angles from a single LED. Additional LEDs 63–64 become illuminated during a fault condition when the light sensor 173 senses a low ambient lighting level, such as at nighttime. The objective is to make housing 30 glow or flash in the dark after a sensed fault condition for better visibility, including from all directions. To this end, potting compound 39 is preferably clear and housing 30 is preferably formed from translucent plastic. Of course, other combinations of materials may be selected to achieve similar results, such as translucent potting compound 39 with a clear or translucent housing 30. When interior LEDs 63–64 are illuminated after sensing a fault condition at reduced ambient light levels, some of LEDs 33–35 are also preferably illuminated to indicate the fault condition from the face 40 of fault indicator 20, depending upon whether the detected fault condition is determined to be permanent or temporary.

FIGS. 4–6 illustrate a fault indicator 20a, which is an alternate embodiment of fault indicator 20 shown in FIGS. 1–3. A primary difference between fault indicators 20 and 20a is that fault indicator 20a in FIGS. 4–6 is not equipped with a battery that is externally replaceable. Thus, housing 30a does not have a battery compartment 28 with a removable cap 29. Instead, a permanent and high-capacity battery 38a is potted in potting compound 39 at the time of manufacture. Since fault indicator 20a consumes battery current mostly during a fault condition, as will be understood more fully below, permanent battery 38a can be expected to last for the lifetime of fault indicator 20a, such as for 10 or more years. Battery 38a is preferably a lithium thionyl chloride battery, such as type TL-593-S manufactured by Tadiran, Ltd. of Israel, which provides a constant 3.6 volt output to depletion. This battery is of the standard C size with a nominal capacity rating of 8.5 ampere-hours. Optionally, battery 38a may be of the standard D size with a nominal capacity of 19 ampere-hours.

FIGS. 7–9 illustrates a fault indicator 20b of the targeted type which utilizes a fault indicating flag 40 instead of LEDs 33–35 to indicate the occurrence of a fault on the monitored conductor 21. An electromagnetic assembly 59 sets and resets the flag 40 in response to the detection of a fault and at the end of a timed reset. The operation of such targeted fault detectors 20b is taught, for example, in co-pending patent application Ser. No. 60/384,608, filed May 31, 2002, and in U.S. Pat. No. 6.016,105, both assigned to the assignee of the present invention. Except for the fault indicating LEDs 33–35, targeted fault indicator 20b can likewise incorporate the structure and operation of the present invention. In addition, due to the electromagnetic flag assembly, it may be desirable in this embodiment to locate circuit board 49 near the current transformer 37. It may also be desirable to use the potting compound 39 in a smaller portion of the internal volume of housing 20b.

Fault indicators 20-20b (collectively fault indicator 20) all preferably have a timed reset to reset some hours after a fault occurs. Thus, fault indicator 20 continues to display the fault by periodically illuminating some of LEDs 33–35, and LEDs 63–64 at nighttime, if implemented, after power is restored in cable 21. This enables a lineman or other service personnel to easily trace the fault by following the illuminated fault indicators. The point of the fault may then be located and repaired, or the cable 21 may be replaced. As will be understood hereinafter, the length of the timed reset may be in the range of 1 to 24 or more hours, and is preferably about 4 hours. Four hours normally provides sufficient time for a lineman or repair crew to review the tripped fault indicators to determine the part of the distribution system associated with the fault.

Rather than waiting for the predetermined reset time to elapse, fault indicator 20 may be manually reset at any time. To this end, a reset magnetic reed switch 120 is disposed in the housings 30–30b. Magnetic reed switch 120 may be manually closed with a permanent magnet tool in a manner known to the art.

Figure 11:
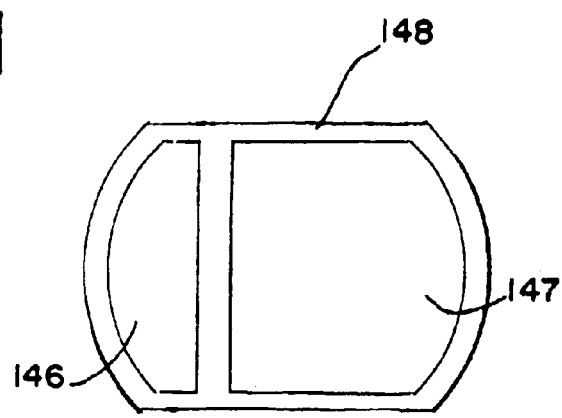
FIG. 11 is a plan view of a first embodiment of an electrostatic plate for the electrostatic pickup shown in FIG. 10.
Figure 13:
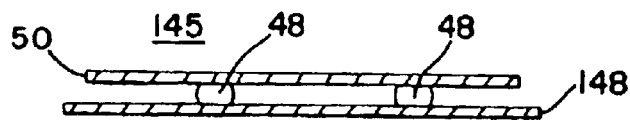
FIG. 13 is a cross-sectional view of the electrostatic pickup illustrated in FIG. 10 taken along section line 13—13.
Figure 14:
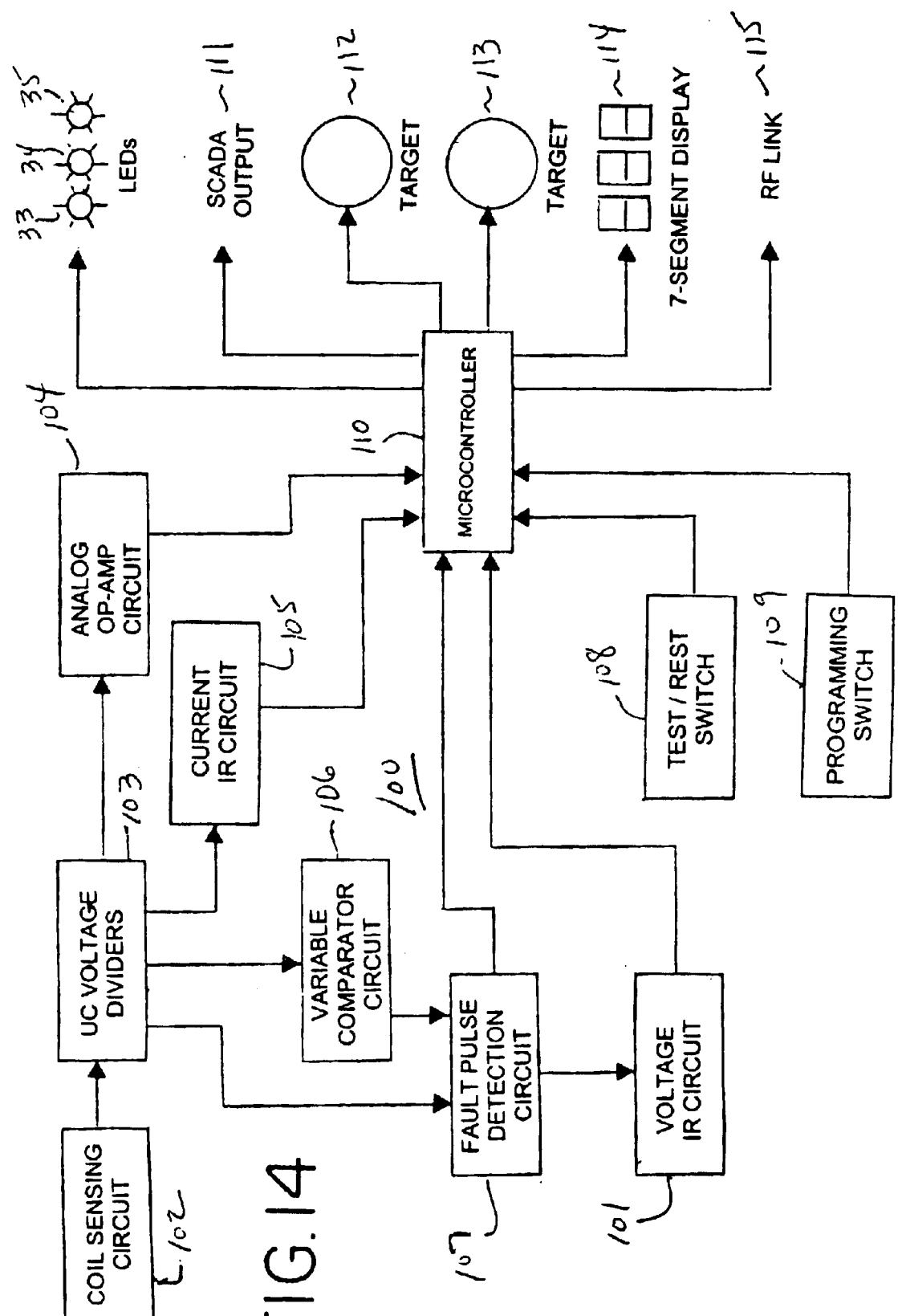
FIG. 14 is a block diagram of the electronic circuitry used in the fault indicators of FIGS. 1–6 showing the functions and interrelationships of the various circuit portions.

Turning now to FIG. 14, the electronic circuitry, generally designated 100, for fault indicator 20 is shown in block diagram form. A voltage inrush restraint circuit 101 includes a voltage sensor which may take the form of an electrostatic sensor 145 shown in FIGS. 10–13. Electrostatic sensor 145 may include a generally rectangular and flat metallic plate 50 overlying an insulating substrate 148 with a pair of metal electrodes 146 and 147 thereon (FIG. 11). For example, metallic plate 50 may be spaced apart from substrate 148 by small insulating spacers 149 (FIG. 13) so that electrostatic coupling exists between metal plate 50 and electrodes 146 and 147. For example, the distance between plate 50 and substrate 148 may be about 2 to 5 mm.

Substrate 148 with the electrodes 146 and 147 thereon may be fabricated by any suitable means, including printed circuit board techniques, deposition of metal on a ceramic substrate or by physically adhering metal foil onto a phenolic base. For example, the electrodes 146 and 147 may be a copper-nickel alloy foil about 10 to 12 thousandths of an inch (0.25 to 0.30 mm) thick. Metallic plate 50 is preferably provided with one or more apertures, such as 149 and 150 for good flow of a potting compound in and about the electrostatic sensor. For example, a urethane-based potting compound may be used, such as that commercially available under the BIWAX brand from the Biwax Corporation of Des Plaines, Ill. BIWAX is a registered trademark owned by the Biwax Corporation.

With reference to FIGS. 3, 6 and 9, the interior of housing 30, 30a or 30b, which houses a magnetic reed switch 120, electrostatic sensor 145, current transformer 37, battery 38 or 38a, interior LEDs 63 and 64 and circuit boards 49 and 49a, may be potted with the potting compound, or any desired portion thereof.

As seen in FIG. 11, electrodes 146 and 147 are preferably of different area such that differences in charge on electrodes 146 and 147 will develop a differential electrical signal between electrodes 146 and 147. For example, the area of electrode 146 may be about 15 to 75 percent of the area of electrode 147, and is preferably about 25 to 50 percent of the area of electrode 147.

Figure 12:
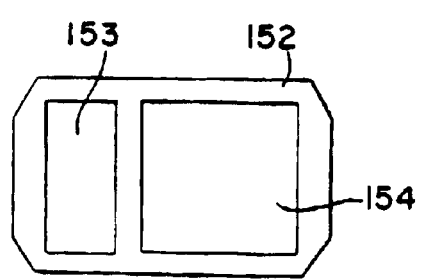
FIG. 12 is a plan view of a second embodiment of an electrostatic plate for the electrostatic pickup shown in FIG. 10.

Illustrated in FIG. 12 is an alternative embodiment of the substrate 14B in FIG. 11. In this embodiment, substrate 152 of insulating material may be of the same approximate rectangular configuration as metal plate 50. Generally rectangular metallic electrodes 153 and 154 are deposited on or adhered to the substrate 152, in a manner similar to substrate 148. Electrode 154 is of greater area than electrode 153 for the same reasons and same purpose as electrodes 146 and 146 in FIG. 11. For example, electrode 153 may be about 15 to 75 percent of the area of electrode 154, and is preferably about 25 to 50 percent of the area of electrode 154.

Electrostatic sensor 145 in FIGS. 10–13 provides excellent immunity to stray electrical fields from adjacent electrical conductors in an electrical distribution system. For example, when the electrostatic pick up portions are physically separated, such as the plate 50 and the conductive band 51 shown in FIG. 3 of U.S. Pat. No. 6,016,105, the separate electrostatic pick up components may cause false triggering upon voltage in-rush in an adjacent conductor, instead of in the monitored conductor. Electrostatic sensor 145 of the present invention substantially avoids these unwanted stray effects and false triggering with the above-described dual electrodes of unequal area disposed on a single substrate 148 or 152.

Returning now to FIG. 14, a coil sensing circuit 102, which includes current transformer 37, senses the load current in monitored conductor 21 including any fault currents. One of a plurality of voltage dividers 103 is selected by microcontroller 110 that corresponds to the selected trip setting. An analog operational amplifier circuit 104 monitors the voltage at the selected voltage divider 103, and provides an output to microcontroller 110. A current inrush restraint circuit 105 monitors any current inrush condition that might cause a false fault detection and provides a logic input signal to microcontroller 110. A variable comparator circuit 106 and a fault pulse detection circuit 107 monitor the voltage dividers 103. Fault pulse detection circuit 107 provides an input signal to microcontroller 110. A voltage inrush circuit 101 also received an input signal from fault pulse detection circuit 107 and provides an input to microcontroller 110. A test/reset switch 108 initiates a test routine in microcontroller 110, or sends a reset signal to the microcontroller. A programming switch 109 is utilized during programming of the microcontroller.

In response to various circuit conditions, microcontroller can activate LEDs 33–35 to indicate that a permanent or temporary fault has occurred. It can optionally provide a SCADA output signal 111. If the fault indicator is of the targeted type, such as shown in FIGS. 7–9, microcontroller 110 can set the target 112 to the fault indicating condition, or it can reset the target 113 to the normal condition after a timed reset interval. Microcontroller 110 may optionally display information on a seven-segment display 114, such as the amount of elapsed time since a fault occurred. The microcontroller may also be optionally provided with a radio frequency (RF) link to report status information to a data or communication system at a remote location, such as a system for monitoring the electrical distribution system that employs a plurality of fault indicators.

Figure 15B:
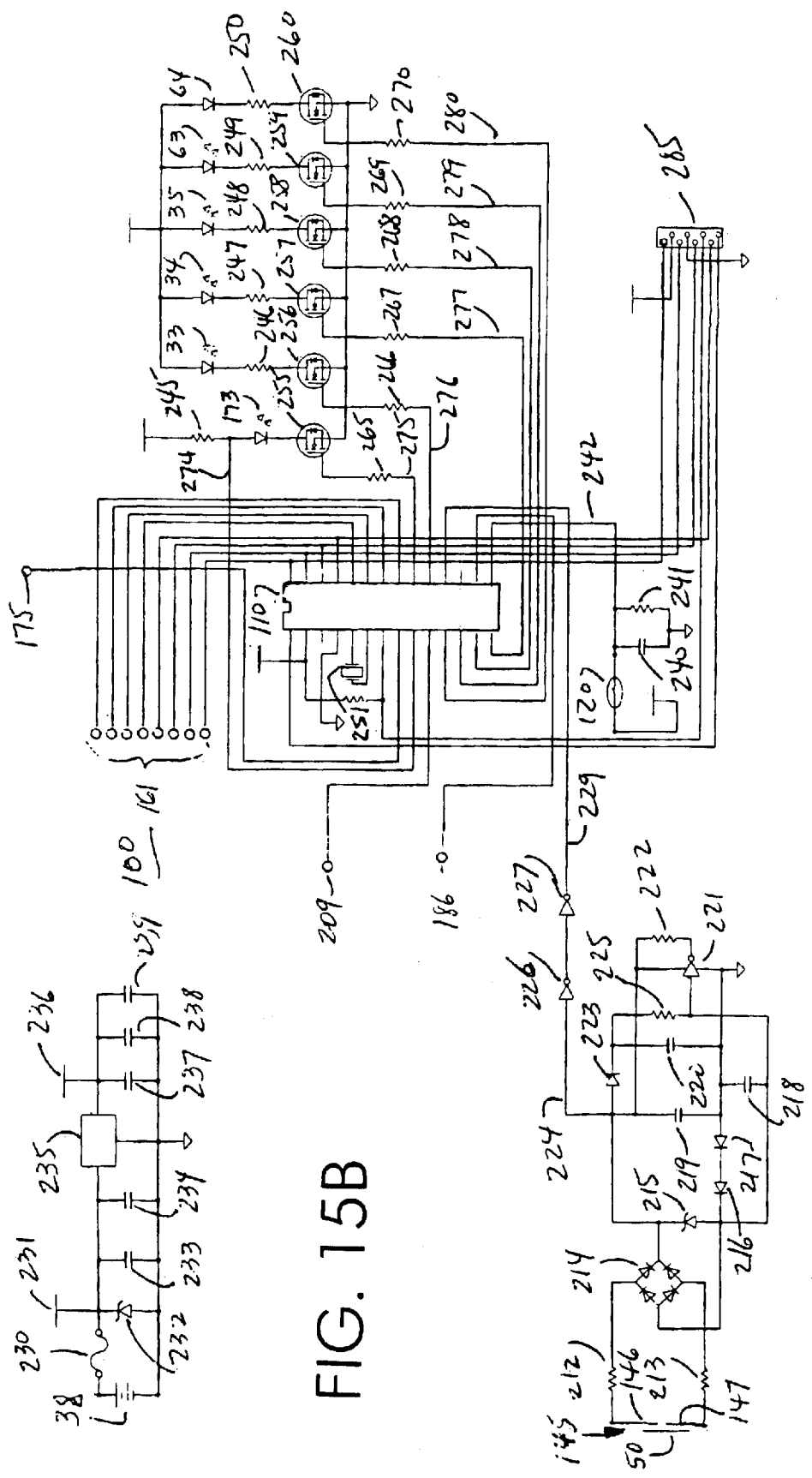

The electronic circuitry 100 for fault indicator 20 is shown in greater detail in the schematic diagram contained in FIGS. 15A–15B. Most of circuitry 100 will typically be located on circuit boards 49 and 49a in housing 30, 30a or 30b (FIGS. 3, 6 or 9). The coil sensing circuit 102 includes current transformer 37, a peak limiting device 119 and a full-wave diode rectification bridge 121. Current transformer 37 may have, for example about 7000 windings on the core 37a, and be able to detect a range of load current in monitored conductor 21 from about 5 A to about 1700 A. The output of current transformer 37, after rectification by bridge 121, is provided at node 131.

The microcontroller voltage dividers 103 include resistors 122–130, and a plurality of semiconductor switches, such as FETs 133–140. Lines 153–160 connect the gate terminals of FETs 133–140, respectively, via a plurality of terminals 161 to corresponding terminals 161 in FIG. 15B to separate output terminals of microcontroller 110. Each of lines 153–160 may be provided with a series resistor, such resistor 163 in line 153. Microcontroller 110 can automatically configure the fault indicator for one of a plurality of current trip settings by rendering one of FETs 133–140 conductive by supplying an appropriate bias signal to the gate of one of the FETS. It will be appreciated that, depending upon which FET 133–140 is conductive, one of resistors 123–130 will be in series with resistor 122 to ground thereby dividing the voltage from the coil sensing circuit 102 at node 131 by the ratio of the resistors 122 and the selected one of resistors 123–130 to provide a voltage divided reference signal on line 132. In effect, resistors 122 and the selected one of resistors 123–130 provide a current load on current transformer 37 to ground.

Resistors 122 and 123–130 are selected such that the reference voltage on line 132 provides a plurality of different current trip settings for the fault indicators 20–20b. For example, rendering FET 133 conductive will configure the fault indicator for a 50 A trip setting. Likewise, FET 134 activates a 100 A trip setting, FET 135 activates a 200 A trip setting, FET 136 activates a 400 A trip setting, FET 137 activates a 600 A trip setting, FET 138 activates an 800 A trip setting, FET 139 activates a 1000 A trip setting and FET 140 activates a 1200 A trip setting. Microcontroller 110 may be programmed to initially set the trip setting at 200 A by activating FET 135, and then adjusting the trip setting upward or downward, if necessary, depending upon the load current sensed by current transformer 37. It will be appreciated that the voltage dividers 103 may be implemented in other forms, such as with a digital potentiometer. Additional voltage dividers may easily be implemented for additional trip settings, such as for 25 A and 2500 A.

The analog operational amplifier circuit 104, including diodes 165–166, op amp 167, resistors 168–169, 171 and 174 and capacitors 170 and 172, will provide a signal on terminal 175 to a corresponding terminal 175 in FIG. 15B to an input terminal of microcontroller 110 when the reference signal on line 132 indicates that the present trip setting needs to be adjusted. Diodes 165–166 protect the non-inverting input of op amp 167 from positive and negative signal spikes. If resistors 168–169 are selected to be of equal resistive value, the output of op amp 167 will follow the input on line 132, but at twice the level on line 132. Thus, as the voltage level on line 132 nears one-half of the presently selected trip setting, the output of op amp 167 at terminal 175 will be interpreted by microcontroller 110 as needing to select the next higher trip setting. Capacitors 170 and 172 and resistors 171 and 174 provide filtering of the output signal of op amp 167. Resistor 171 may be selected to be low in resistive value compared to resistor 174 to avoid substantial attenuation of the op amp output signal at terminal 175.

The fault pulse detection circuitry 107 includes op amp 180, resistors 178–179, 181 and 183, capacitor 182 and inverters 184–185. Op amp 180 monitors the potential on line 132 at its non-inverting input. Its inverting input is supplied with a reference voltage, such as about 3.1 volts, by the voltage dividing resistors 178–179. Thus, the output of op amp 180 will be near zero until the potential on line 132 rises above 3.1 volts, such as in response to a current fault in monitored conductor 21. Resistors 181 and 183 and capacitor 182 provide filtering of any noise signals, or the like. Inverters 184–185 drive line 187, which is connected to an input terminal of microcontroller 110 through terminal 186. Thus, when a high potential appears on line 132, the output of op amp 180 goes high and line 187 to microcontroller 110 switches to a logic high level. Microcontroller 110 will interpret the logic high signal to indicate that a current fault has occurred on monitored conductor 21.

The basic functions of the voltage inrush restraint circuit 101 are to determine whether there is a voltage in conductor 21, such as by sensing the collapse of the electromagnetic field about conductor 21 when the voltage falls during a fault or when a reclosing relay otherwise opens, and to inhibit activation of the display 40 to the fault indicating position when power is restored to the electrical distribution system. The basic functions of the current inrush restraint circuit 105 are similar, except that the current inrush restraint monitors the current in conductor 21 by receiving the rectified signal from current transformer 37. In overhead applications, either voltage or current inrush restraint, or both, may be used. In underground applications, current inrush restraint is used. Of course, when power is restored, as by closing of the reclosing relay, there is likely to be a subsequent current inrush or surge in conductor 21 because of the preexisting load on conductor 21. It is therefore desirable for the fault indicator 20 to avoid interpreting this current inrush as a fault condition on conductor 21.

It is also desirable to have the fault indicator 20 avoid falsely interpreting noise, arcing, transients, or the like, on conductor 21 as a fault. To this end, fault indicator 20 preferably has a delayed trip response time. Typically, in overhead applications, the delayed trip response time may be in the range of about 1 to 50 ms and typically about 24 ms. In underground applications, the delayed trip response time may be in the range of about 1 to 24 ms and typically about 1 ms.

The current inrush restraint circuit 105 includes op amp 196, resistors 190, 194–195, 198–199 and 205, diodes 191–192, Zener diodes 197 and 204, capacitors 200–201 and 206, and inverters Z02–203 and 207. Op amp 196 monitors the output of the current sensing circuitry 102 at node 131 via resistor 190 connected to its non-inverting input. Resistors 190 and 193 divide the signal at node 131. The inverting input of op amp 196 is biased at a small reference potential by voltage dividing resistors 194 and 195. Normally, the signal at the non-inverting input of op amp 196 will exceed the signal at the inverting input and the output at Zener diode 197 will be at a logic high level, which forward biases Zener diode 197 to render it conductive. Resistor 198 is small in resistive value to resistor 199 so that a high signal also appears at the input of inverter 202. Capacitors 200–201 filter noise, or the like. Inverters 202–203 provide a logic high level to resistor 205 and Zener diode 204, which begins to charge up capacitor 206. Preferably, capacitor 206 is an electrolytic capacitor of a large capacitive value. As capacitor 206 is charged, inverter 207 will supply a logic low level on line 208 to terminal 209 to an input terminal of microcontroller 110. If power is lost on conductor 21 for a short time and then restored, capacitor 206 will still be charged because of its high impedance discharge paths. Thus capacitor 206 will cause inverter 207 to continue supplying a low logic level to microcontroller 110, thus inhibiting microcontroller 110 from misinterpreting a voltage inrush upon restoration of power to conductor 21 as a fault current condition.

With reference to FIG. 15B, the voltage inrush circuit 101 includes electrostatic sensor 145, resistors 212–213, 222 and 225, full-wave diode rectification bridge 214, Zener diode 215, diodes 216–217 and 223, capacitors 218–220, and inverters 221 and 226–227.

Electrostatic sensor 145 is shown consisting of a metallic plate 50, a smaller electrode 146 and a larger electrode 147. Each of electrodes 146 and 147 is connected through a current limiting resistor 212 and 213, respectively, to a full-wave diode rectification bridge 214 to supply a DC voltage to the voltage inrush restraint circuitry. A Zener diode 215 may be selected to limit the voltage from diode bridge 214 to approximately 5 volts. A capacitor 219 quickly charges up to the input voltage. Another capacitor 220 also quickly charges up to near the input voltage through a diode 223. However, if line voltage is temporarily lost, diode 223 will prevent rapid discharge of capacitor 220 except through the slower discharge path of a resistor 225. A pair of diodes 216 and 217 operates to impress a negative bias of about 1.5 volts at the input of an inverter 221, which will cause the output this inverter to assume a logic high state. A capacitor 218 is connected across diodes 216–217. Thus, line 224 is normally at a logic high level.

However, if a voltage inrush condition is sensed, some energy is transferred from capacitor 219 to capacitor 220, which positively biases the input of inverter 221. The output of inverter 221 then switches to a low logic output and quickly discharges capacitor 219 through resistor 222 to ground, as well as sinking any current continuing to be rectified by diode bridge 214. Capacitor 220 discharges much more slowly through resistor 225, keeping the output of inverter 221 at a low state. Line 224 to inverters 226–227 is then kept at a logic low level, as is line 229 to an input terminal of microcontroller 110. This voltage inrush restraint circuit is effective for a wide range of applications. For example, this restraint circuit will perform effectively in a wide range of applications from 69 kilovolt lines down to 2.4 kilovolt lines.

As previously described, a magnetic reed switch 120 may be used to reset the fault indicator. A capacitor 240 and resistor 241 filter line 242 from reed switch 120 to an input terminal of microcontroller 110.

The circuitry shown in FIG. 15B also includes a power supply including battery 38, fuse 230, Zener diode 232, integrated circuit voltage regulator 235 and capacitors 233–234 and 237–239. Zener diode 232 clips any noise on the input line to the voltage regulator. As previously mentioned, the voltage of battery 38 is about 3.6 volts, as at terminal 231. Voltage regulator 235 provides a regulated voltage of about 3.3 volts at terminal 236 for most of the electronic circuitry. However, because of the higher current consumption, LEDs 33–35 and 63–64 operate more efficiently directly from the 3.6 volt battery.

Microcontroller 110 is normally in a standby or sleep mode in which it draws virtually no power from battery 38. For example, microcontroller 110 may typically draw 7 microamperes, or less, from battery 38 or 38a when it is in the sleep mode and about 200 microamperes when it is in the active mode. Such a microcontroller is commercially available from Tex. Instruments of Dallas, TX under part number MSP430F1232. Sleep states or modes are sometimes also referred to as a power down mode. Microcontroller 110 may, in general, be any microcontroller, microprocessor or programmable controller that has a low current drain, especially in the sleep mode.

It is of course desirable to minimize the current drain on battery 38 to maximize the lifetime of the battery and make it possible for battery 38 to last the expected lifetime of the fault indicator so that the battery never needs replacement. A crystal 251 sets the clock rate for the microcontroller, which may be about 32 kHz.

FETs 256–260 control the LEDs 33–35 and 63–64, respectively, via lines 276–280 to the gates of FETs 256–260. Resistors 246–250 limit the current conducted through each of the LEDs when the associated FET is conductive. Thus, microcontroller 110 can independently control the illumination of LEDs 33–35 and 63–64 by controlling activation of FETs 256–260 on its output lines 276–280. Thus, different permutations or combinations of the illumination of these LEDs are possible besides those disclosed herein.

A photo sensor 173 is connected in series with a resistor 245 and an FET 255. For example, photo sensor 173 may be a cadmium-sulfide cell or a phototransistor. FET 255 is normally biased off by a line 275 from microcontroller 110 to further conserve battery power. Once microcontroller 110 is awakened, the microcontroller checks the ambient light level by temporarily applying a bias on line 276 to render FET 255 conductive. Preferably, microcontroller 110 does not sense the ambient lighting conditions until a fault is detected since there is no need to illuminate LEDs 33–35 or 63–64 before then. For example, microcontroller 110 may briefly sample the ambient lighting conditions about once every 15 to 60 minutes after a fault is detected and while the fault detector is in the timed reset mode.

Microcontroller 110 then senses the voltage across photo sensor 173 on line 274. If bright light prevails, photo sensor 173 may have an impedance of about 1000 ohms. Since resistor 245 is about 100K ohms, the voltage across photo sensor 173 and on line 274 to the microcontroller will be near zero. However, if the ambient light level is nearly dark, the impedance of photo sensor 173 may be about 5M ohms. In this instance, the voltage across photo sensor 173 will be near the regulated output voltage of about 3.3 volts. Thus, microcontroller 110 can distinguish between low ambient lighting levels and high ambient lighting levels.

Figure 16:
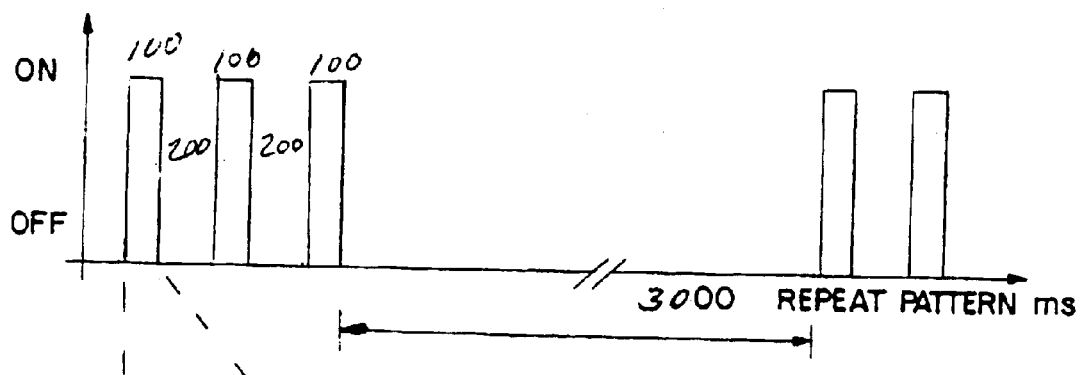
FIG. 16 is a timing diagram showing a preferred illumination pattern for the LEDs used in the fault indicators of FIGS. 1–6.

Microcontroller 110 then decides whether to operate LEDs 33–35 and 63–64 in the lower power nighttime mode or LEDs 33–35 in the higher power daytime mode. Of course, the internal LEDs 63–64 only operate in the nighttime mode. FIG. 16 illustrates a preferred illumination pattern for LEDs 33–35 during in the daytime mode. Upon detecting a fault, the battery power is applied to LEDs 33–35 in three 100 ms pulses, which are separated by 200 ms of off time. Microcontroller 110 accomplishes this by activating lines 276 and 278 to apply power to LEDs 33 and 35 if the fault indicator has detected a permanent fault, or by activating line 277 to apply power to LED 34 if the fault indicator determines that a temporary fault has occurred. This pattern is then repeated every three seconds for about-three times. The fault indicator may then assume a sleep mode for about 3 seconds before again illuminating LEDs 33–35 in the sequence of FIG. 16.

Figure 17:
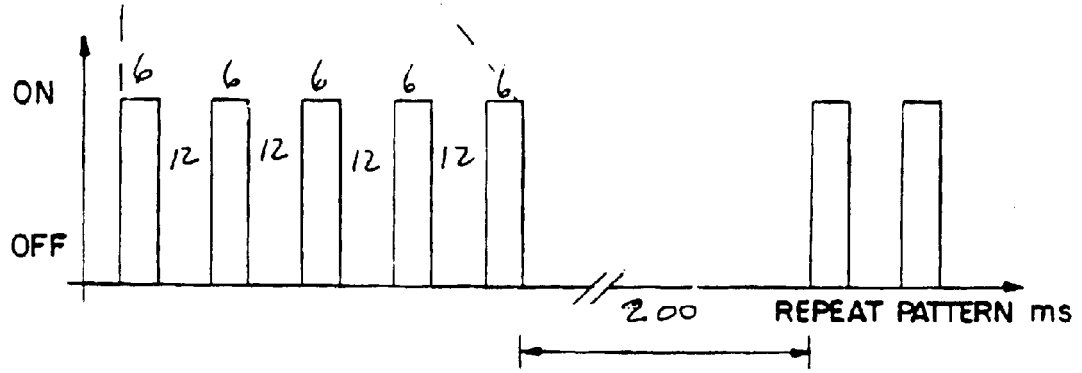
FIG. 17 is a timing diagram showing a preferred illumination pattern for applying lower power to the LEDs used in the fault indicators of FIGS. 1–6 under night time conditions.

If the fault indicator is operating in the nighttime mode, lower power will be applied to LEDs 33 and 35, or to LED 34, as indicated in FIG. 17. In the nighttime illumination mode, each 100 ms pulse in FIG. 16 becomes a plurality of 6 ms pulses separated by 12 ms of off time. Thus, the nighttime illumination mode uses about 33 percent as much power as the daytime mode. Because the human eye cannot see separate pulses of such short duration, the net effect is a dimmer visual appearance to the lower power nighttime illumination patterns. Interior LEDs 63–64 may be similarly powered in the nighttime mode. This pulsed form of supplying power to LEDs 33–35 and 63–64 will further conserve battery power.

Microcontroller 110 may begin illuminating LEDs 33–35 and 64–64 immediately upon detection of a fault or after a predetermined delay since service personnel are not likely to immediately arrive after a fault occurs.

To further save on battery current drain, LEDs 33–35 and 63–64 are preferably not continuously illuminated in either the daytime or nighttime modes. Instead, as shown in FIG. 16, LEDs 33–35 are preferably pulsed on for about 100 ms three times, with about 200 ms of off time between the pulses, with power being enabled to the LEDs only intermittently during the pulses. These pulses are then followed by an off time of about 3 seconds when preferably no further pulses appear. However, this off time is not critical and may generally range from about 2 to 10 seconds. Preferably, this pattern of pulses may be repeated about every 2 to 10 seconds. This provides the eye-catching illumination characteristic desired to call attention to a fault occurrence while further limiting current drain and conserving battery life. Of course, many variations will be apparent to those skilled in the art with respect to the on/off times, such as pulsing LEDs 33–35 on for about five times instead of -the illustrated three times, altering the various time periods, and the like.

The previously described nighttime LEDs 63–64 disposed in the interior of housing 30, 30a or 30b may be actuated by biasing FETs 259–260 into their conductive states when microcontroller 110 determines from photo sensor 173 that there is low ambient lighting that will provide housing 30 with a glowing effect if LEDs 63–64 are continuously powered. However, if LEDs 63–64 are intermittently powered or pulsed, such as in accordance with the diagrams in FIGS. 16 and 17, housing 30 will provide a flashing effect.

A connector 285 has a plurality of conductors to microcontroller 110 and to other portions of circuitry 100 to enable programming of microcontroller 110.

The fault indicator 20 preferably has a timed reset to assist in following the path of a fault along the power distribution lines. If the fault indicator reset upon termination of the fault, information about the location of temporary faults would frequently be lost before service personnel could arrive to investigate. Accordingly, once a fault is detected, the fault indicators preferably continue to display the fault condition, such as by LEDs 33–35 and/or LEDs 63–64 for a predetermined amount of time such as from 1 to 24 hours, and preferably about 4 hours. After the predetermined time, fault indicator 20 will automatically reset itself including termination of illumination of any LEDs 33–35 and/or 63–64, termination of sampling of photo sensor 173 and microcontroller 110 will resume its normal sleep mode.

A reset switch 120 has an input on line 242 of microcontroller 110 for manually resetting the fault indicator with a magnetic tool at any time. If fault indicator 20 is manually reset, any LEDs 33–35 and 63–64 will be deactivated and microcontroller 110 will return to its sleep mode.

Due to the typical outdoor environmental conditions that the fault indicators 20 are subjected to when installed on the conductors of a power distribution system, 10 years is about the expected lifetime of these fault indicators. Advances in the state of the technology can also be expected to obsolete fault indicators in about 10 years. Thus, the low current drain of circuitry 100 in combination with the high capacity of battery 38a provides a fault indicator 20 in which the battery can be realistically expected to last the lifetime of the fault indicator, without any needed or required replacement of the battery during the operative lifetime of the fault indicator.

Figure 18:
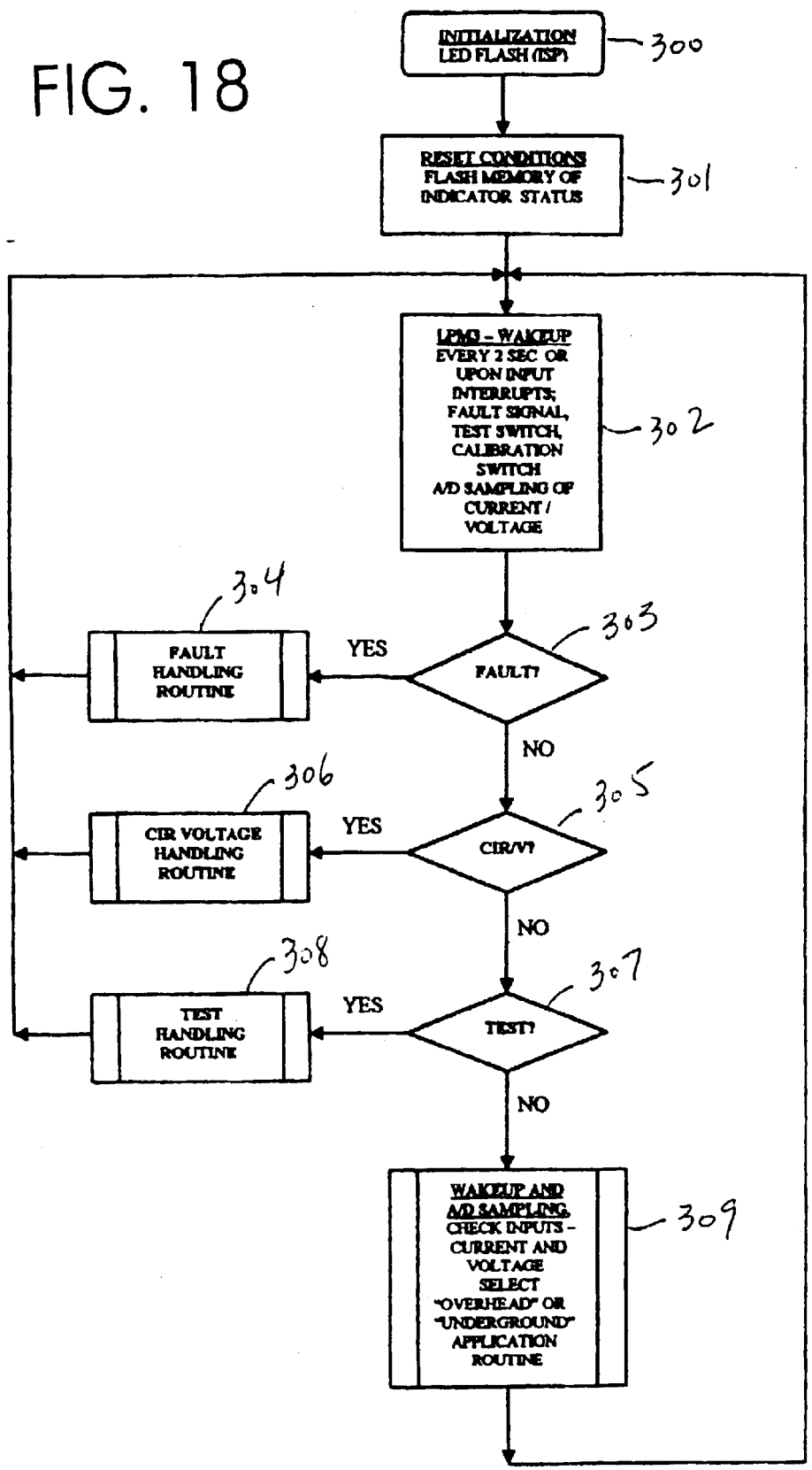
FIG. 18 is a flow chart illustrating typical steps that may be employed by a microcontroller during the various operational modes of the fault indicators illustrated in FIGS. 1–9.

FIG. 18 is a flow chart illustrating typical steps that may be employed by microcontroller 110 during its various modes of operation. Initialization occurs at block 300. Any reset conditions are checked at block 301, and the last status of the fault indicator is obtained from flash memory, which may be internal in microcontroller 110. At block 302, a wakeup routine is initiated about every two seconds. Upon wakeup, microcontroller 110 checks for any interrupts, any fault signal, and any inputs from the test switch, calibration switch and A/D sampling of current/voltage. Operation then moves to decision block 303 to determine if a fault is occurring. If so, block 304 initiates the fault handling routine, which is further described below with reference to FIGS. 19A and 19B. If no fault is detected, the operation moves to block 306 where any current inrush or voltage inrush condition is monitored. If any such inrush condition exists, the operation moves to block 306 for initiation of the current inrush or voltage inrush routines. These inrush routines are described in greater detail below with reference to FIG. 20. If no inrush condition exists, operation moves to decision block 307 to determine if the fault indicator is in the test mode. If so, operation moves to block 308 where the test handling routine is initiated, as described in greater detail below with reference to FIGS. 21 and 22. If the test mode has not been selected, operation moves to block 309 for the wakeup and sampling mode, which checks inputs, selects current and voltage and decides whether the fault indicator is in an overhead application or an underground application. This wakeup and sampling mode, including automatic configuration of the trip setting, is further described below with reference to FIG. 23.

Figure 19A:
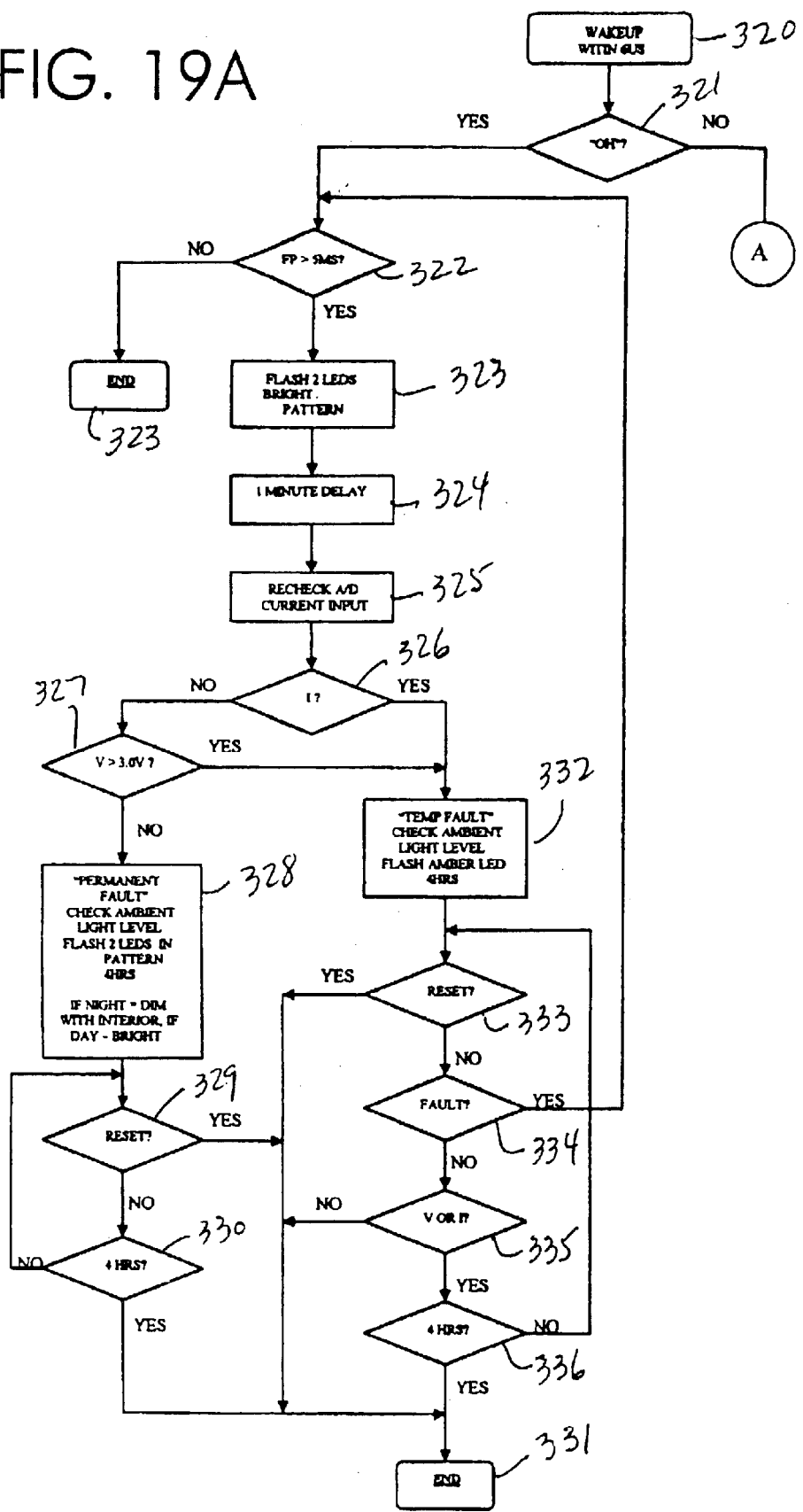
FIGS. 19A and 19B are flow charts illustrating typical steps that may be employed by a microcontroller during a fault handling routine shown in one of the blocks in FIG. 18.
Figure 19B:
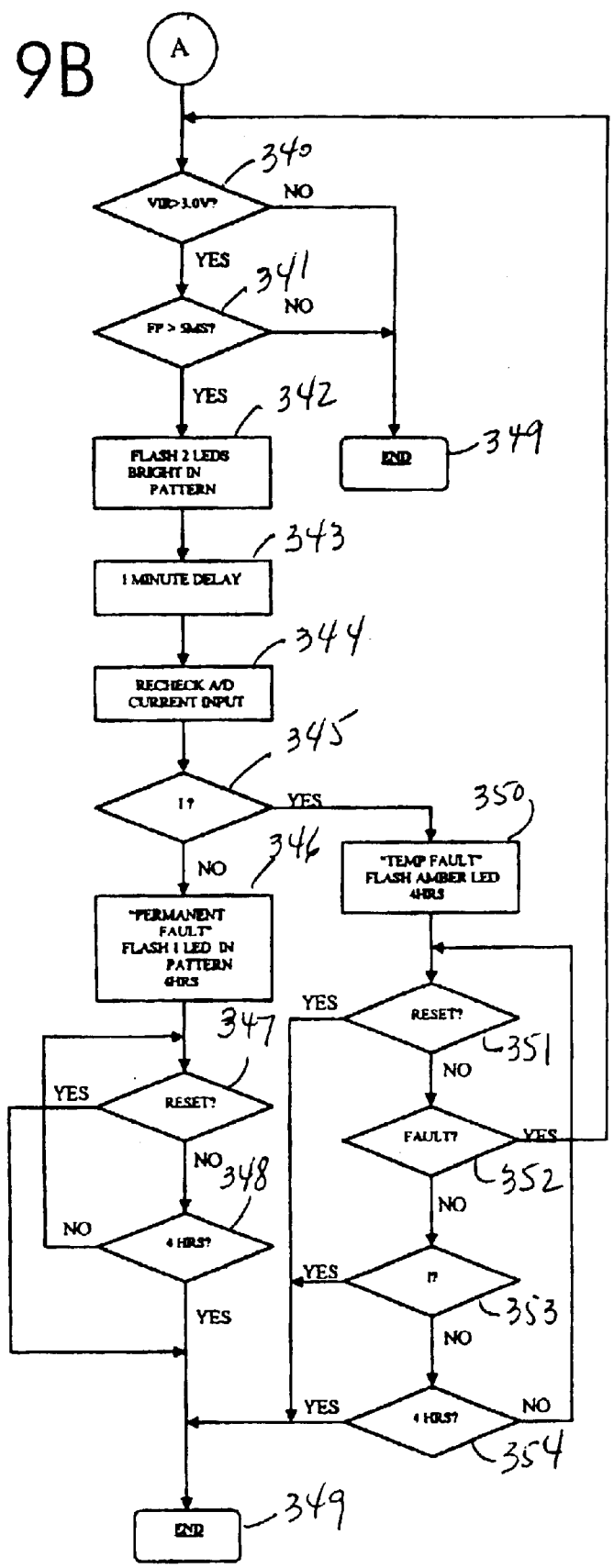

FIGS. 19A and 19B are flow charts illustrating typical steps utilized by microcontroller 110 during the fault handling routine. As indicated in block 320, microcontroller 110 can wakeup within 6 microseconds of any change in input, such as upon the occurrence of a fault. At block 321, microcontroller determines whether the fault indicator is in an overhead application rather than an underground application. If the application is overhead, the process moves to block 322, which determines if a detected fault pulse is greater than 5 ms. This is intended to eliminate noise or transients that might otherwise falsely trigger a fault condition. If not, the process ends at block 323. If the fault is greater than 5 ms, microcontroller 110 activates permanent fault indicating LEDs 33 and 35 in the bright pattern of FIG. 16. After about a one-minute delay at block 323, microcontroller 110 rechecks its inputs at block 325. At block 326, microcontroller 110 determines if there is still current in conductor 21. If so, the previously detected fault did not cause a reclosing relay to lockout. Accordingly, microcontroller determines that the fault is temporary and moves to block 332. However, if it is determined that there is no current in conductor 21 at block 326, the process moves to block 327, which checks the voltage on line 132 in FIG. 15A, which is the signal representative of the load current in conductor 21. As previously described, a voltage level of greater than 3.0 volts on line 132 indicates that the selected trip setting is exceeded, but there has been no interruption of power supplied to conductor 21 by a reclosing relay, circuit breaker or the like. Thus, microcontroller 110 determines that the fault is temporary and the process moves to block 332. However, if the voltage on line 132 is not greater than 3.0 volts, microcontroller 110 determines that the fault is permanent at block 328. It then checks the ambient light levels with light sensor 173. If it is daytime, LEDs 33 and 35 flash in accordance with the pattern shown in FIG. 16. If it is nighttime, LEDs 33 and 35 flash in accordance with the lower power of FIG. 17, and interior LEDs 63 and 64 will also be illuminated in accordance with FIG. 17. At block 329, microcontroller 110 checks to see if any reset signal is received, such as from magnetic reed switch 120. If so, the process ends at block 331. If there is no reset signal, block 330 checks to see if 4 hours has elapsed since the fault was first detected. If not, LEDs 33 and 35 (and LEDs 63–64 during nighttime) continue to flash. When the timeout period of 4 hours is reached, the process ends.

If the fault was previously determined to be temporary at block 332, the ambient light levels are checked with light sensor 173. If it is daytime, the temporary LED 34 flashes in accordance with the pattern shown in FIG. 16. If it is nighttime, LEDs 34 and 63–64 will flash in accordance with the lower power of FIG. 17. At block 333, microcontroller 11.0 checks to see if any reset signal is received, such as from magnetic reed switch 120. If so, the process ends at block 331. If there is no reset signal, block 334 determines if another fault has occurred, and if so, the process returns to block 322. If no new fault has occurred, microcontroller 110 checks the condition of conductor 21 at block 335 to see if voltage or current is still present on the conductor. If not the process ends because the line is dead and no temporary fault continues to exist. If voltage or current is present on conductor 21, block 336 checks determines if timed reset period of 4 hours has elapsed. If so, the process ends at block 336. However, if not, the process returns to block 333.

Returning to block 321, if it is determined that the fault indicator is configured for underground application instead of overhead application, the process proceeds via connector A to decision block 340 in FIG. 19B. If the voltage inrush is less than 3volts at block 340, the process ends at block 349. However, if the inrush voltage output is greater than 3 volts, microcontroller 110 determines whether the fault pulse is greater than 5 ms in duration. If not, the process ends at block 349. If the fault pulse is greater than 5 ms, microcontroller 110 begins to flash one of the permanent fault LEDs 33 or 35. Only one of the LEDs 33 or 35 is used because the fault indicator 20 is likely to be in a transformer enclosure, or the like, in an underground application. Thus, visibility from a distance is not needed. After a one-minute delay, microcontroller 110 rechecks its inputs including the current input at block 343. If there is a current in conductor 21, the microcontroller decides that a temporary fault has occurred and the process proceeds to block 350. However, if microcontroller 110 determines that there is no current in conductor 21, the fault is determined to be permanent and the process proceeds to block 346. Microcontroller 110 continues to flash one of permanent fault LEDs 33 or 35 in the low power pattern of FIG. 17. Block 347 checks to see if any reset signal occurs. If so, the process ends at block 349. If not, the permanent fault indication continues for the predetermined time out period of 4 hours, block 348, at which time the process ends.

If it was previously determined that the fault was temporary at block 350, the microcontroller activates the temporary fault LED 34 for up to 4 hours. If any reset signal occurs during the 4-hour interval, block 351 will terminate the temporary fault mode at end block 349. If another fault is sensed while in the 4 hour timed reset mode at block 352, the process is sent back to block 340 to again determine the characteristics of the fault. If the fault indicator determines that the line current is restored in conductor 21 at block 353 during the temporary fault mode, the process ends at block 349. Otherwise, microcontroller 110 continues to flash temporary fault LED 34 until 4 hours is timed out at block 354.

Each time that the microcontroller processes end, such as at end blocks 323, 331 or 349 in FIGS. 15A and 15B, microcontroller 110 terminates illumination of LEDs 33–35 and 63–64 and resets the fault controller to the conditions that existed prior to detection of a fault signal.

Figure 20:
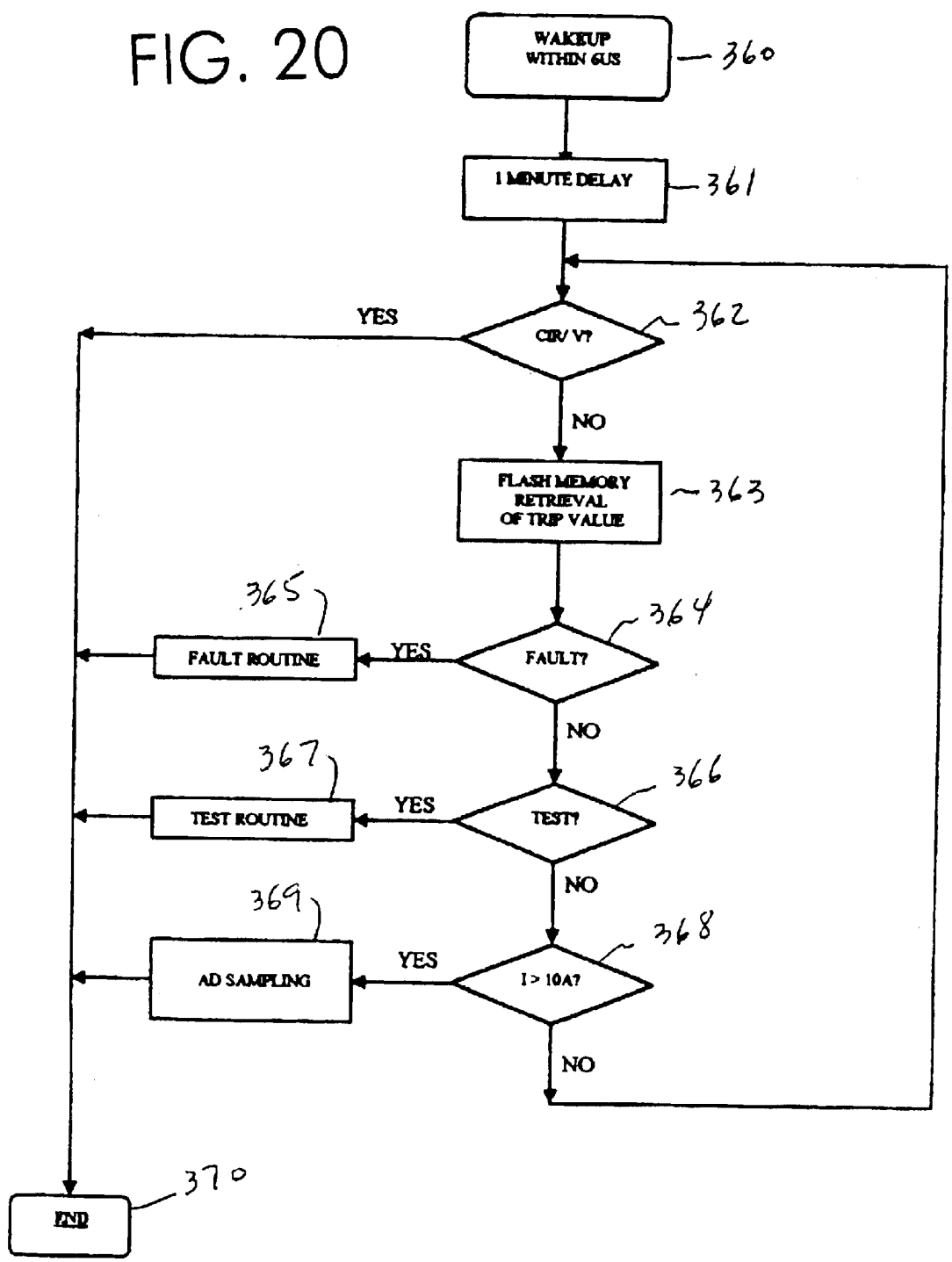
FIG. 20 is a flow chart illustrating typical steps that may be employed by a microcontroller during current and voltage inrush routines shown in another block in FIG. 18.

The current inrush restraint and voltage inrush restraint routines are shown in FIG. 20. When microcontroller 110 wakes up at block 360, there is a one minute delay at block 361 before the inrush restraint conditions are evaluated at block 362. If current inrush or voltage inrush is detected, the process ends at block 370. This will prevent microcontroller 110 from falsely determining that a fault has occurred if there is current or voltage inrush on conductor 21. If no inrush restraint conditions are detected at block 362, the last trip value is retrieved from flash memory at block 363. If at fault is determined at block 364, the fault routine is initiated at block 365, as already presented with respect to FIGS. 15A and 15B. Otherwise, block 366 determines if the test mode has been selected. If so, the test routine is initiated at block 367, which is presented below with respect to FIG. 21. If the test mode is not selected, microcontroller 110 determines if the load current on conductor 21 exceeds 5 A at block 368. If not, the process returns to block 362. However, if the current is greater than 5 A, microcontroller 110 begins sampling of the current on conductor 21 and determines if the trip setting needs reconfiguration. Further consideration of the configuration settings and procedures is presented below with respect to FIG. 23.

Figure 21:
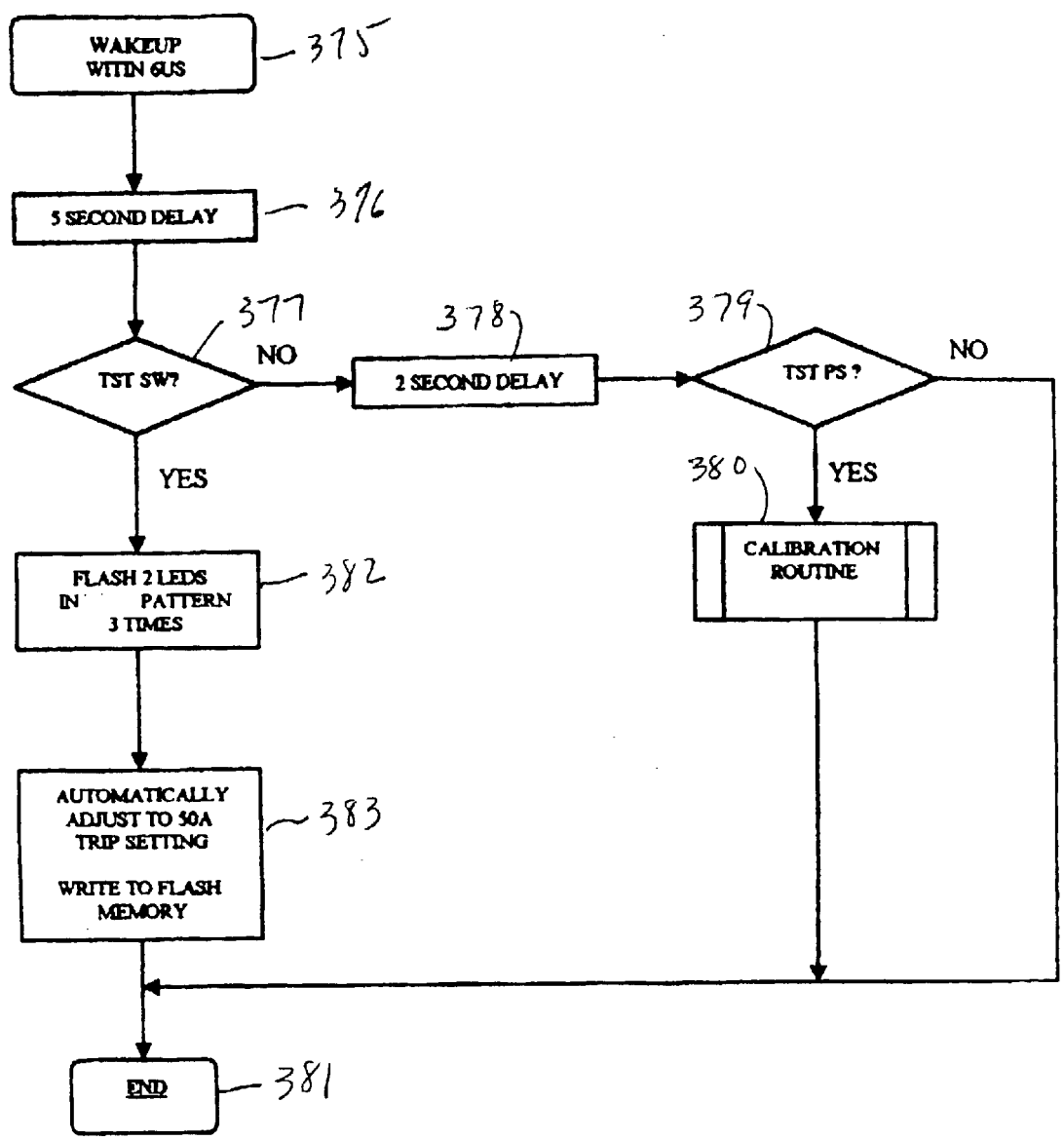
FIG. 21 is a flow chart illustrating typical steps that may be employed by a microcontroller during a test handling routine shown in yet another block in FIG. 18.
Figure 22:
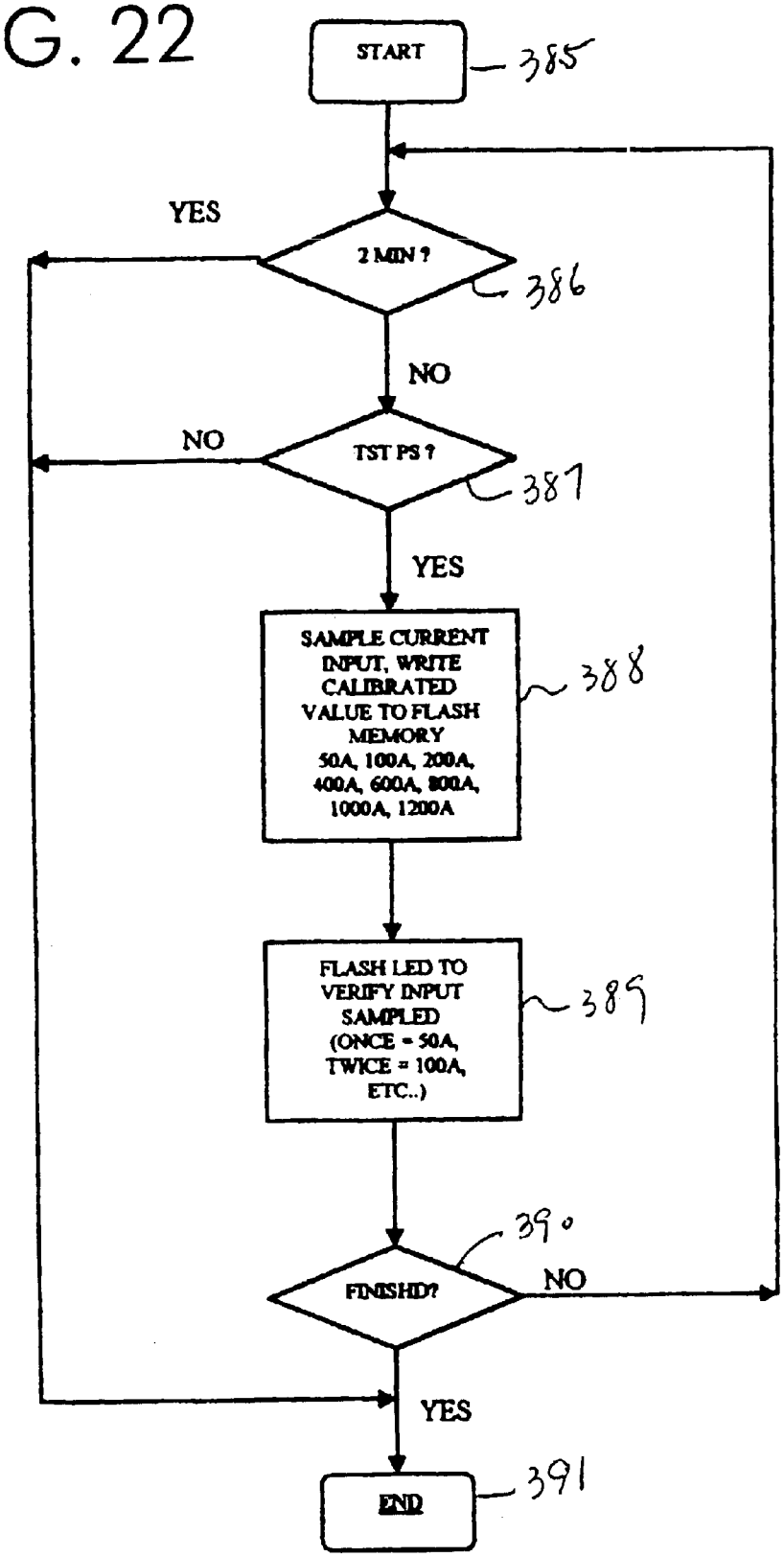
FIG. 22 is a flow chart illustrating typical steps that may be employed by a microcontroller during another test routine, including the auto-calibration procedure.

The test routines are shown in the flow charts of FIGS. 21 and 22. After waking up at block 375 and after a 5 second delay at block 376, microcontroller 110 determines if an input has been received from a test switch to initiate the test routine. If so, after a 2 second delay at block 378 and after confirming a test pulse at block 379, testing of the calibration procedure begins at block 380, as presented below in FIG. 22. If not, the process ends at block 381.

If the test switch was activated at block 377, microcontroller 110 flashes LEDs 33 and 35 in the pattern shown in FIG. 16 for three times at block 382. Flashing of LEDs 33 and 35 also confirms that battery 38 has adequate power. It automatically sets the fault indicator for the default 50 A trip setting at block 383 and writes this trip setting in the flash memory. The test procedure then ends at block 381.

In accordance with a primary aspect of the present invention, the fault indicator 20 may be automatically calibrated. The sequence for the automatic calibration routine is shown in FIG. 22. Calibration is desirable because of manufacturing variances in the current sensor 37 and because of manufacturing tolerances in other components. After starting the sequence at block 385, and after a delay of about 2 minutes, microcontroller 110 looks for a test pulse at block 387 to confirm that the auto-calibration mode has been selected. It will be appreciated that the auto-calibration process depends upon having the fault indicator 20 in a test environment where currents of known magnitude for each of the plurality of trip settings are in conductor 21. Of course, for the purposes of calibration, multiple fault indicators 20 may be on the conductor 21 at the same time. If no test pulse occurs, the process ends at block 391.

If the test pulse occurred, microcontroller 110 samples the current in conductor 21, such as by monitoring the potential on line 132 in 15A. Each of the voltage dividers associated with each of the trip setting selection FETs 133–140 will be sequentially activated for each of the respective trip settings. Microcontroller 110 selects the appropriate trip setting for calibration and writes the calibrated value to flash memory. The calibrated value that is written into memory may be in the form of a correction factor for each trip setting. The trip settings to be calibrated may be 25 A, 50 A, 100 A, 200 A, 400 A, 600 A, 800 A, 1000 A, 1200 A or 2500 A, or any subset thereof. A reference frequency or pulse width modulation signal may be provided to microcontroller 110 on the test connector 285 in FIG. 15B to inform the microcontroller of the trip setting that it should be calibrating at that time. As calibration is progressing or after calibration is over, microcontroller 110 flashes one of LEDs 33–35 to indicate that each trip setting has been calibrated, such as once for 50 A, twice for 10 A, and so forth, up to eight flashes for 1200 A. Preferably, the trip settings are calibrated to within about five percent accuracy. If the procedure is finished at block 390, the process ends at block 391. If not, the process returns to block 386.

Figure 23:
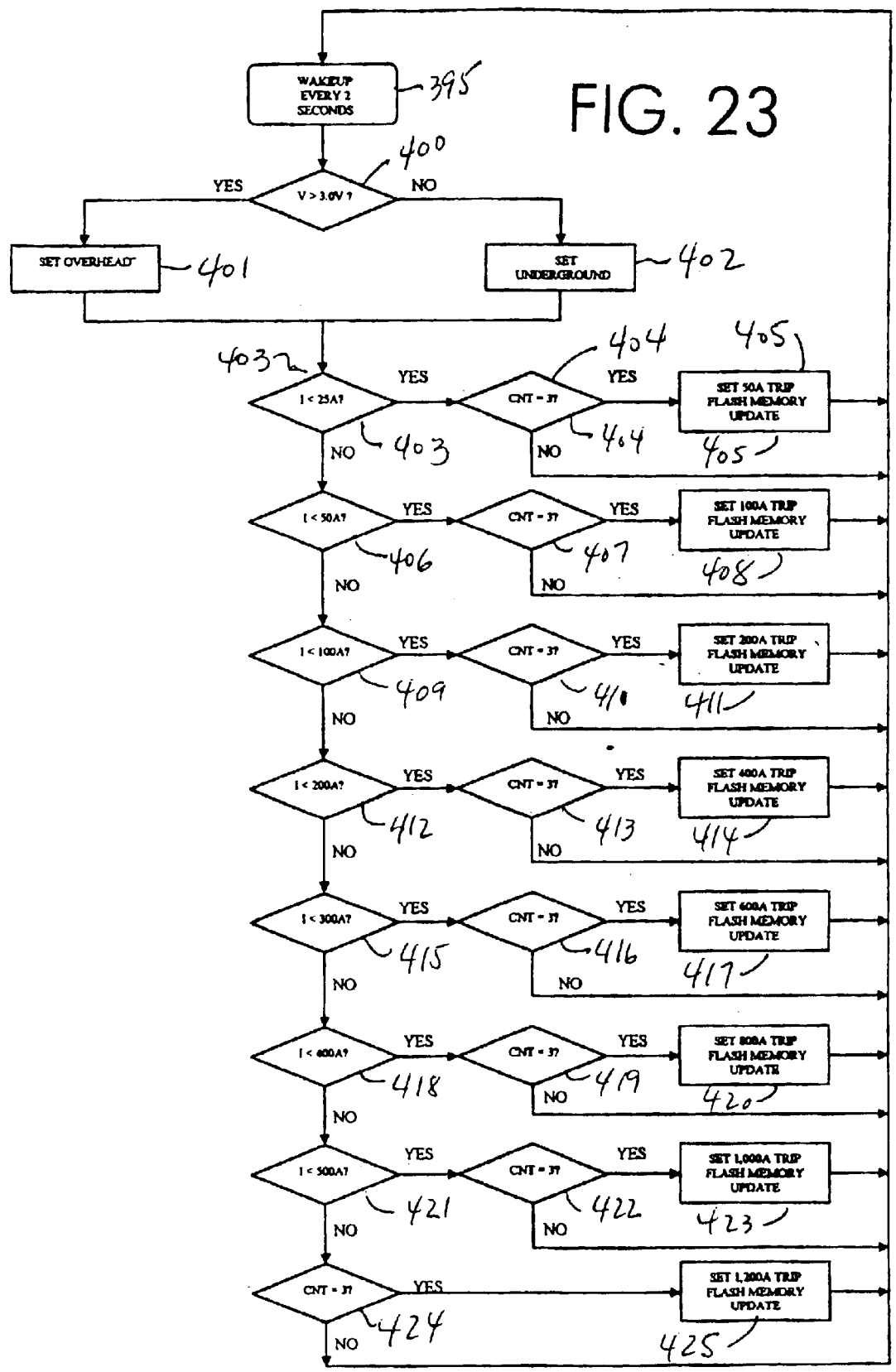
FIG. 23 is a flow chart illustrating typical steps that may be employed by a microcontroller during an analog to digital (A/D) sampling routine, the wakeup routine, the overhead/underground configuration routine, and the auto-configuration routine shown in another of the blocks of FIG. 18.

The wakeup routine, the overhead/underhead routine and the auto-calibration routine are shown in FIG. 23. Microcontroller 110 wakes up every 2 seconds as shown in block 395. It then monitors the signal from the electrostatic sensor 145. If the fault indicator is configured for an overhead application, the electromagnetic field about conductor 21 will cause differential voltages to be induced in the plates of sensor 145, which will provide a high logic signal at the input to microcontroller 110. Accordingly, the fault indicator will be set to an overhead mode. However, if the fault indicator is in an underground application, there will be an inappreciable electromagnetic field about conductor 21 and the input to microcontroller 110 will be at a logic low level, which will cause it to be configured for an underground mode at block 402.

Irrespective of whether it is in an overhead mode or an underground mode, automatic configuration of the trip settings begins at block 403. At block 403, microcontroller 110 determines if the current in conductor 21 is less than 25 A. If so, it next checks to see if a sample counter has taken three samples of the load current in conductor 21. If so, the trip setting for fault indicator 20 is set at 50 A and the 50 A trip setting is stored in flash memory. If three samples of the load current have not already been taken at block 404, the process returns to block 395. If the load current in conductor 21 was greater than 25 A at block 403, microcontroller 110 determines if it is less than 50 A at block 406. If so, and if the sample count equals 3, the fault indicator is configured for a trip setting of 100 A at block 408 and the 100 A trip setting is stored in flash memory. Since the succeeding steps are similarly and repetitively executed, it can be summarized that blocks 409–411 set the trip setting at 200 A if the load current is between 50 and 100 A, blocks 412–414 set the trip setting at 400 A if the load current is between 100 and 200 A, blocks 415–417 set the trip setting at 600 A if the load current is between 200 A and 300 A,;blocks 418–420 set the trip setting at 800 A if the load current is between 300 A and 400 A, blocks 421–423 set the trip setting at 1000 A if the load current is between 400 A and 500 A, and blocks 424–425 set the trip setting at 1200 A if the load current is above 500 A.

After the initial configuration, microcontroller 110 continues to monitor the load current in conductor 21. If the load current in conductor 21 fluctuates above or below the load current for the configured trip setting, microcontroller 110 will automatically reconfigure the trip setting to a different setting that is appropriate for the load. Thus, the fault indicator of the present invention automatically adapts to changing load currents in conductor 21. However, if a permanent fault occurs, the auto-configuration procedure is stopped until the line current returns or until the fault indicator is reset so that the fault indicator does not ramp down to the lowest trip setting of 50 A. Instead, when line current is restored or when the fault indicator is reset, the initial trip setting will be that previously stored in the flash memory.

Figure 24:
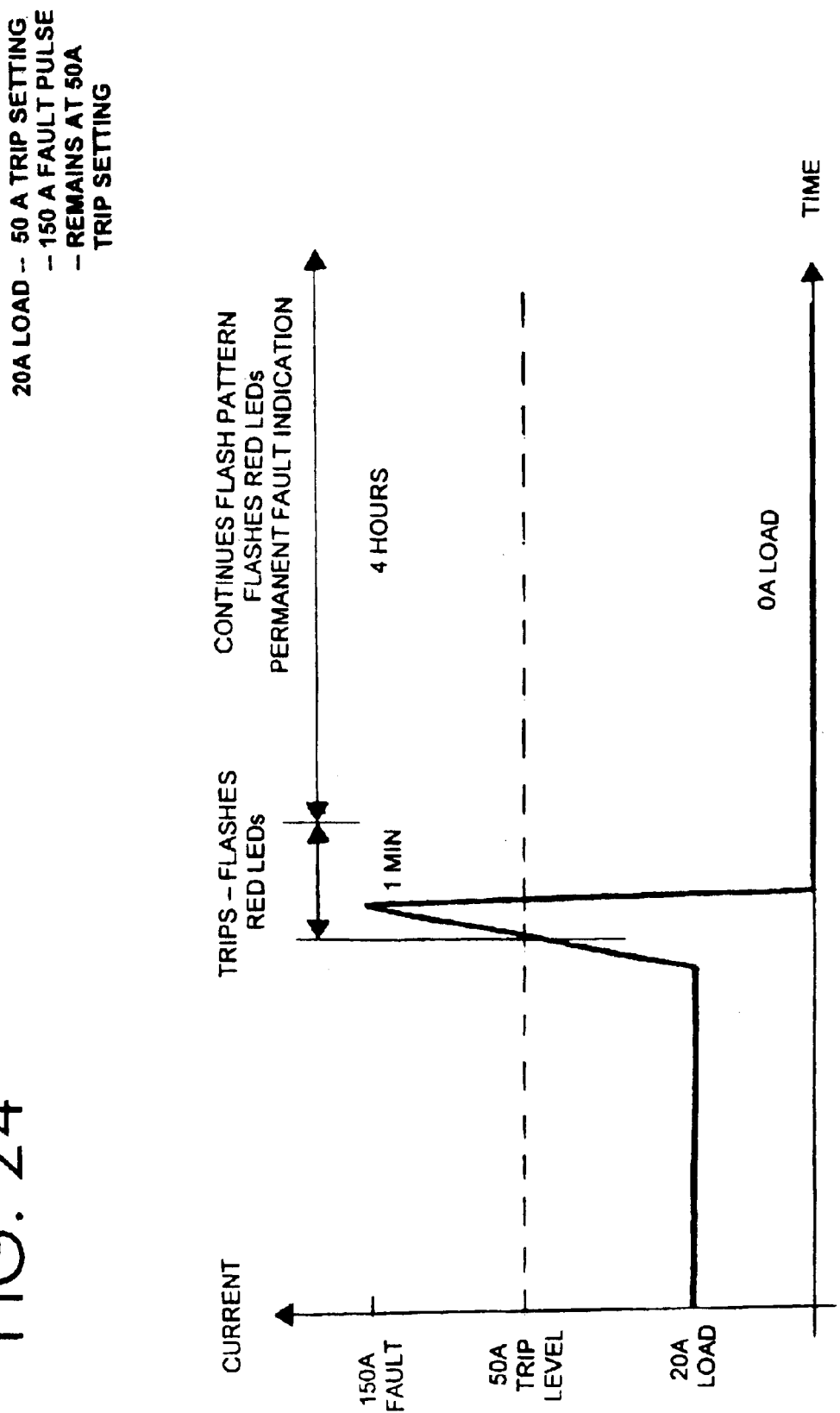
FIG. 24 is a diagrammatic illustration of the response of the fault indicator of the present invention to a 150 ampere (A) current fault in a monitored conductor when the trip setting is set at 50 A.

FIGS. 24–32 illustrate the response and adaptability of fault indicator 21 to various types of conditions that may be encountered. In FIG. 24, the load current is initially 20 A. Since the load current is below 25 A, microcontroller 110 set the trip setting at 50 A. A 150 A fault subsequently occurs, which causes the fault indicator to trip and to begin illumination of the permanent fault LEDs 63 and 65. After one minute, the microcontroller again checks the current in conductor 21 and finds it to be zero. Thus, microcontroller 110 continues to flash the permanent fault LEDs until the reset period of 4 hours elapses when the microcontroller automatically resets the fault indicator. When the fault indicator is reset, LEDs 63 and 64 stop flashing. The trip settings remained at 50 A during the entire period.

Figure 25:
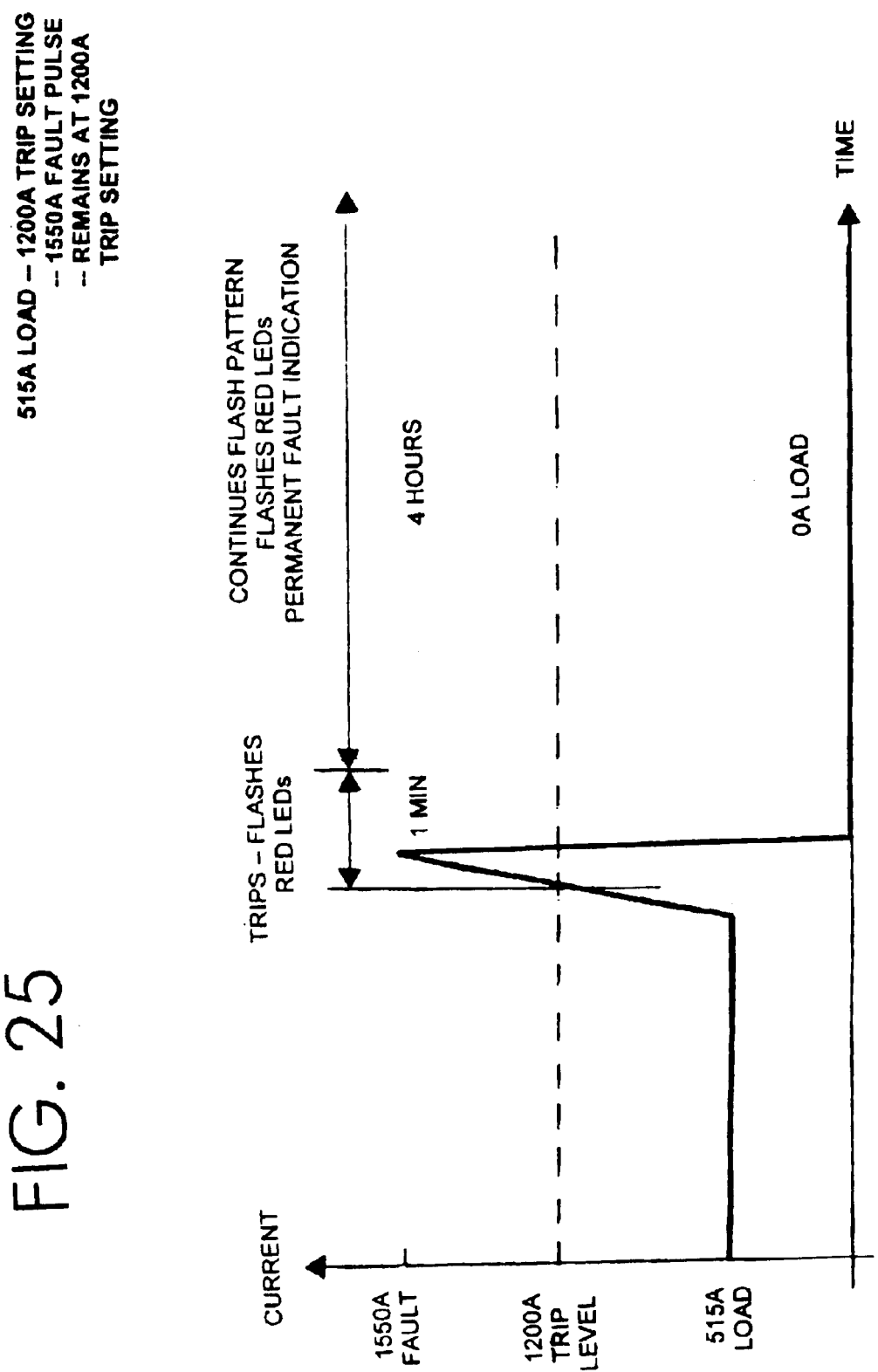
FIG. 25 is a diagrammatic illustration of the response of the fault indicator of the present invention to a 1550 A current fault in a monitored conductor when the trip setting is set at 1200 A.

In FIG. 25, the trip setting is initially set at 1200 A because the load current exceeds 500 A. Subsequently, a 1500 A fault exceeds the 1200 A trip setting and microcontroller 110 energizes permanent fault LEDs 33 and 35 in the pulsed pattern of FIG. 16. After one minute, the load current is at zero, which the microcontroller interprets as a permanent fault. Thus, LEDs 33 and 35 continue to flash until the 4-hour timed reset period elapses.

Figure 26:
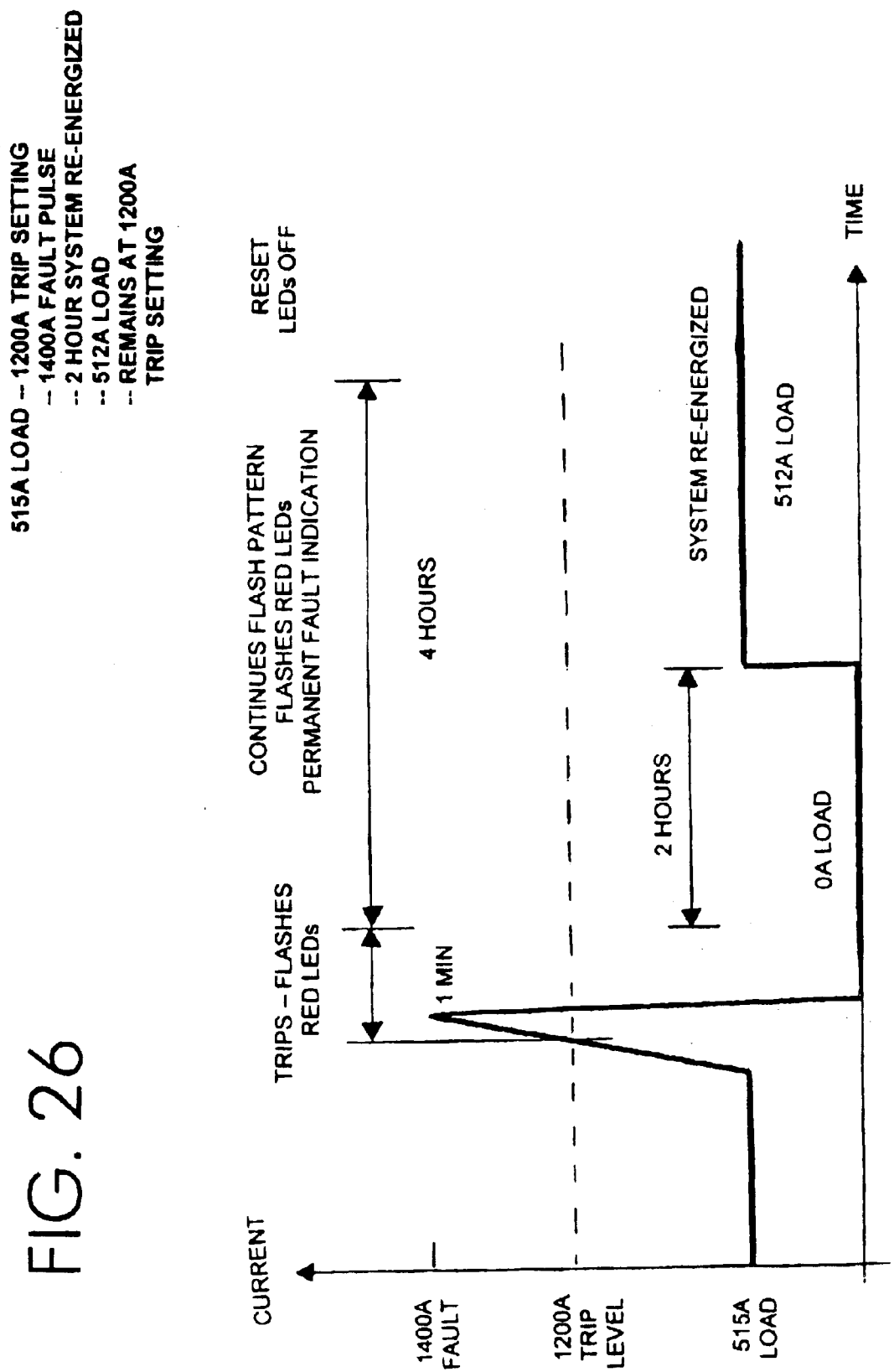
FIG. 26 is a diagrammatic illustration of the response of the fault indicator of the present invention to a 1400 A current fault in a monitored conductor when the trip setting is set at 1200 A, followed by a subsequent re-energization of the monitored conductor.

In FIG. 26, the trip setting is again initially set at 1200 A since the load current exceeds 500 A. A subsequent 1400 A fault exceeds the trip setting of 1200 A, causing the fault indicator to indicate that a fault has occurred by flashing the permanent fault LEDs 33 and 35. After one minute, the load current is zero, and microcontroller 110 determines that the fault is permanent. After 2 hours of the 4 hour timed reset, the distribution system is reenergized with the load current at 512 A. However, fault indicator 20 continues to display the previously determined fault condition until the end of the four-hour timed reset elapses and the fault indicator is reset.

Figure 27:
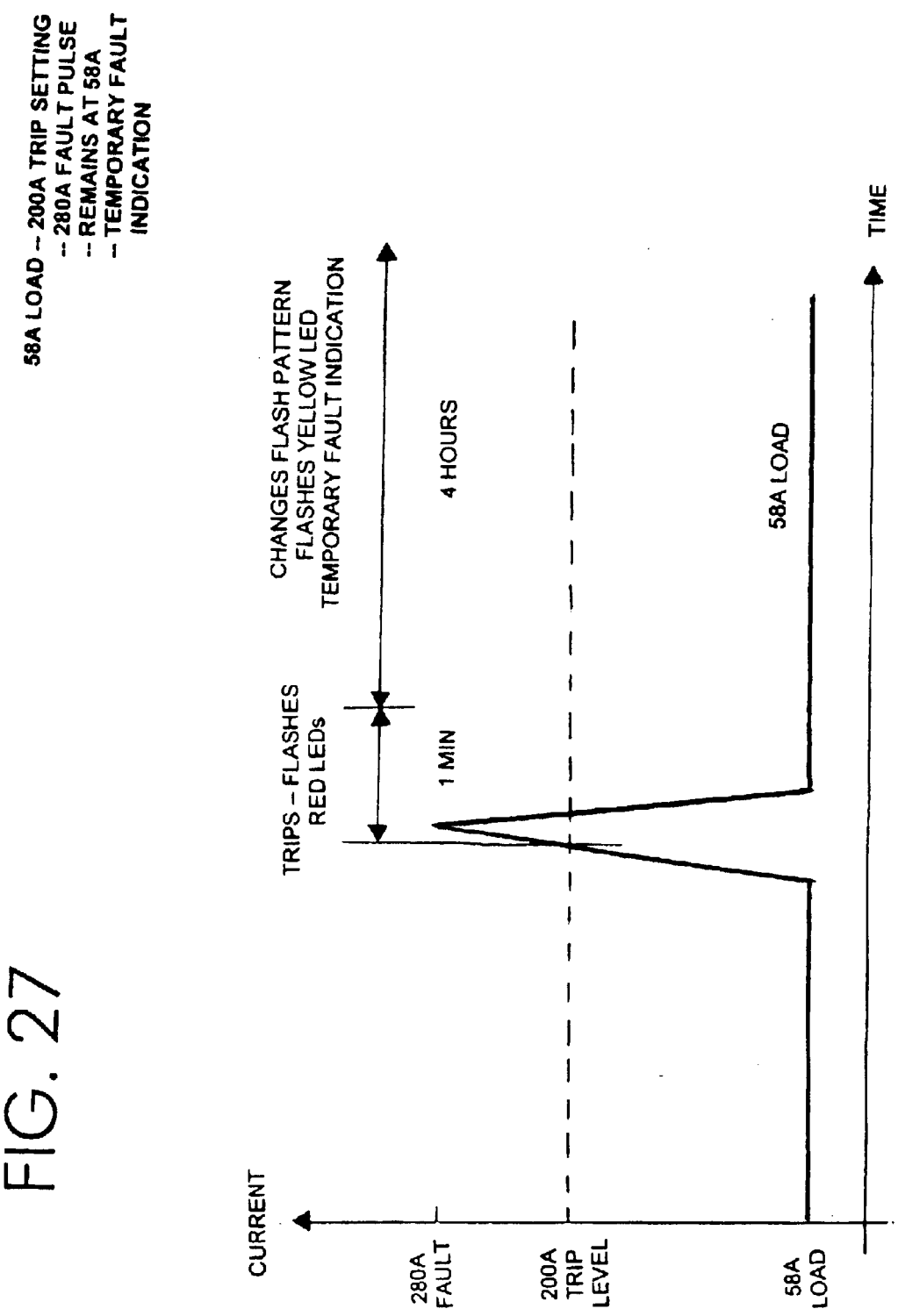
FIG. 27 is a diagrammatic illustration of the response of the fault indicator of the present invention to a 280 A temporary current fault in a monitored conductor when the trip setting is set at 200 A.

In FIG. 27, the trip setting is initially set at 200 A because the load current is between 50 A and 100 A. A subsequent fault of 280 A exceeds the trip setting and microcontroller 110 begins flashing LEDs 33 and 35 in the permanent fault mode. However, load current remains at 58 A after one minute. Microcontroller 110 thus determines that a temporary fault has occurred. After one minute, microcontroller 110 changes the flash pattern to flash only the temporary fault LED 34 until the end of the timed reset period.

Figure 28:
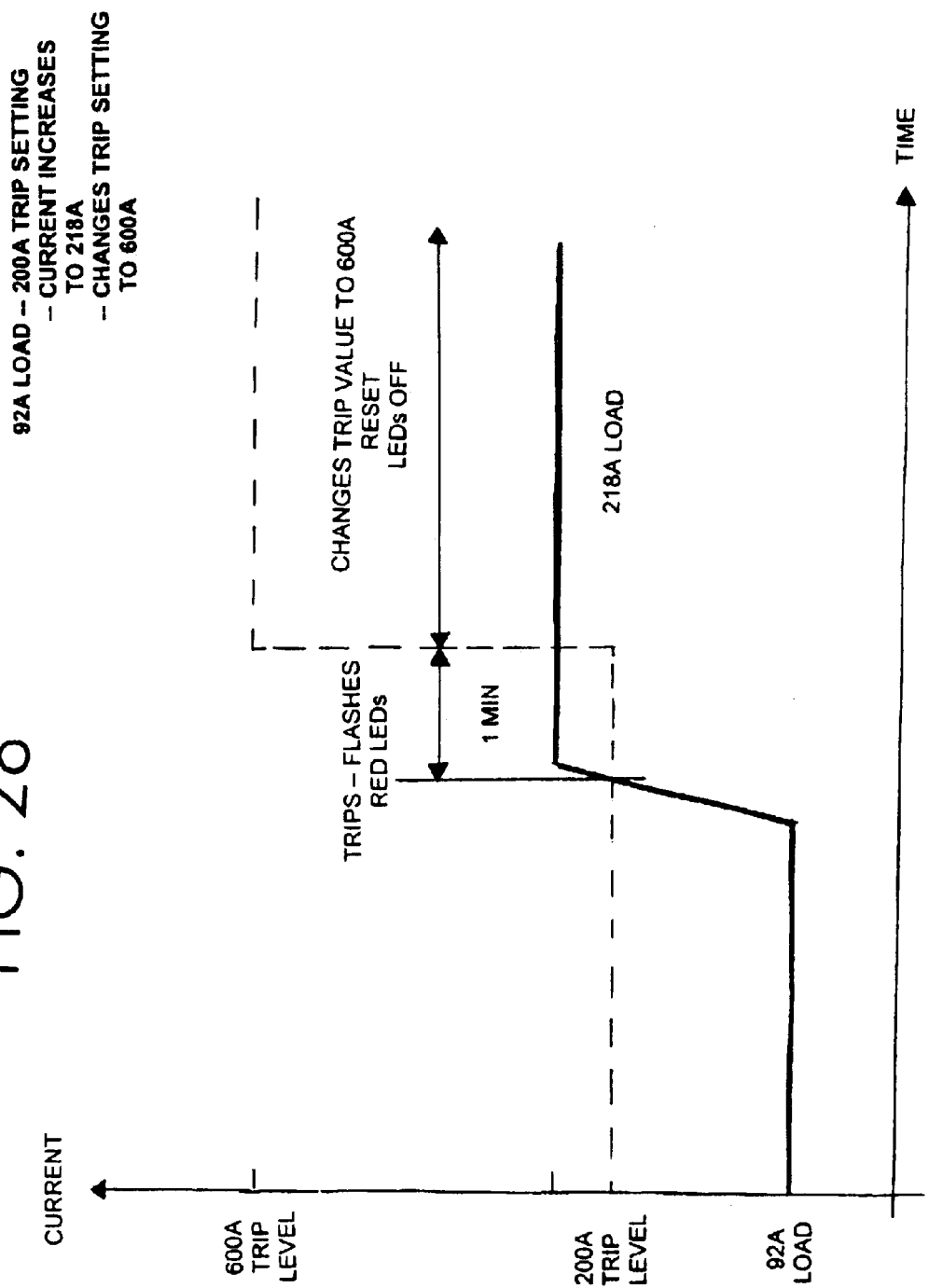
FIG. 28 is a diagrammatic illustration of the response of the fault indicator of the present invention to an increase in load to 218 A in a monitored conductor when the trip setting is originally set at 200 A, with a subsequent change of the trip setting to 600 A.

In FIG. 28, the trip setting is initially set at 200 A because the load current is between 50 A and 10 A. Later, the load current increases to 218 A, which exceeds the 200 A trip setting. Microcontroller 110 begins flashing the permanent fault LEDs 33 and 35. At the end of one minute, the load current remains at 218 A. Microcontroller 110 then determines that there has been a change in load current that exceeded the original trip setting, not a permanent or temporary fault. The trip setting is then reconfigured at 600 A for the 218A load, and the permanent fault LEDs 33 and 35 are extinguished. Note that in this example, the change in load current that exceeded the original trip setting caused the microcontroller to correspondingly change the trip setting to a new setting corresponding to the change in load current.

Figure 29:
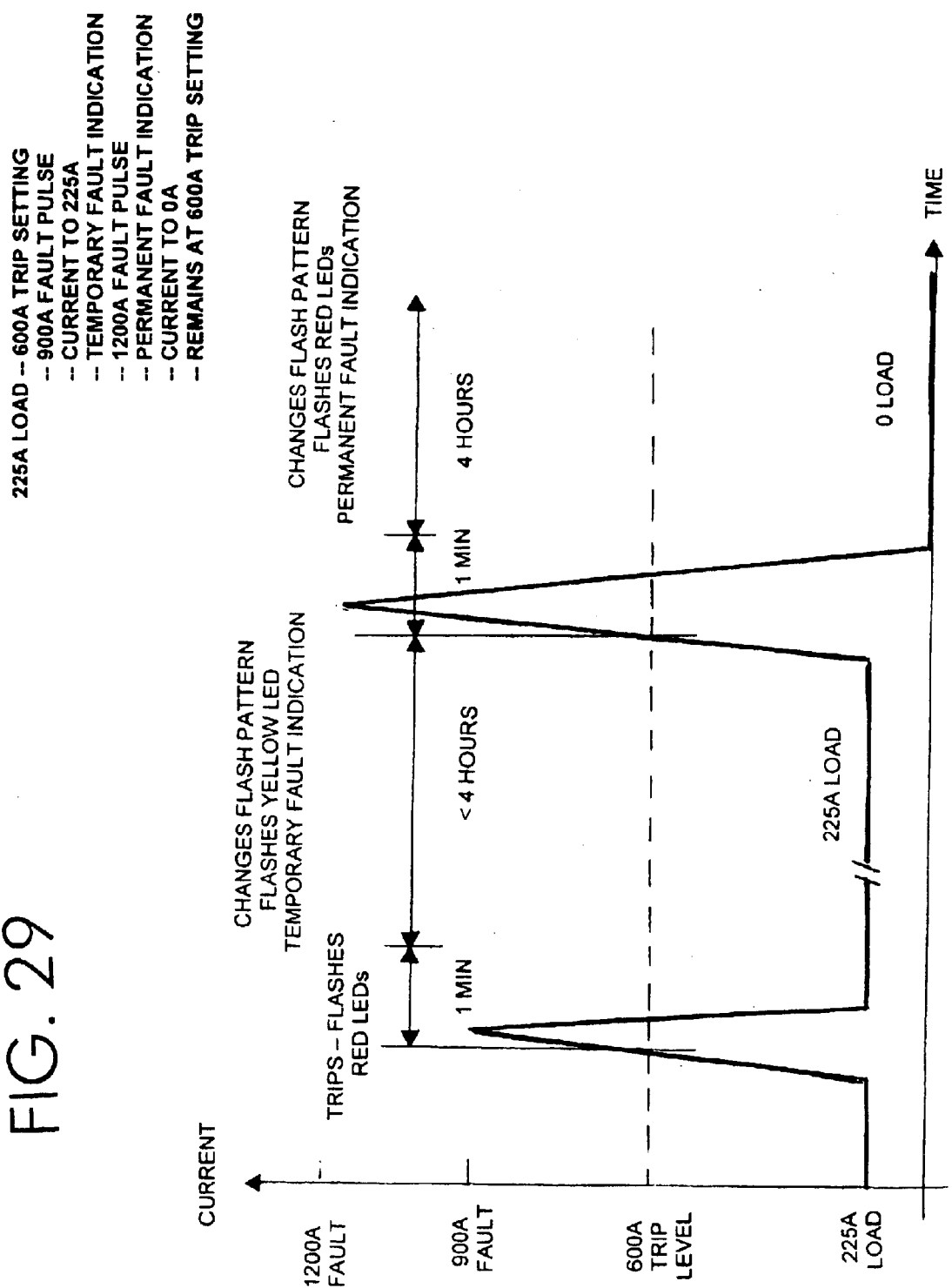
FIG. 29 is a diagrammatic illustration of the response of the fault indicator of the present invention to a 900 A temporary current fault in a monitored conductor when the trip setting is set at 600 A, followed by a 1200 A permanent current fault.

In FIG. 29, an initial load current of 225 A results in an initial configuration of the trip setting at 600 A. A subsequent 900 A fault causes the permanent fault LEDs 33 and 35 to be flashed. However, at the end of one minute, the microcontroller determines that the load current remains at 225 A and that a temporary fault therefore occurred. The temporary fault LED 34 then begins flashing for the four hour timed reset period. However, before the four hours elapses, another fault of 1200 A occurs. Microcontroller 110 then begins to flash the permanent fault LEDs 33 and 35. After one minute, the microcontroller determines that the load current is now zero, confirming that a permanent fault has occurred. It then causes the permanent fault LEDs to continue flashing for a new four hour-timed reset period.

Figure 30:
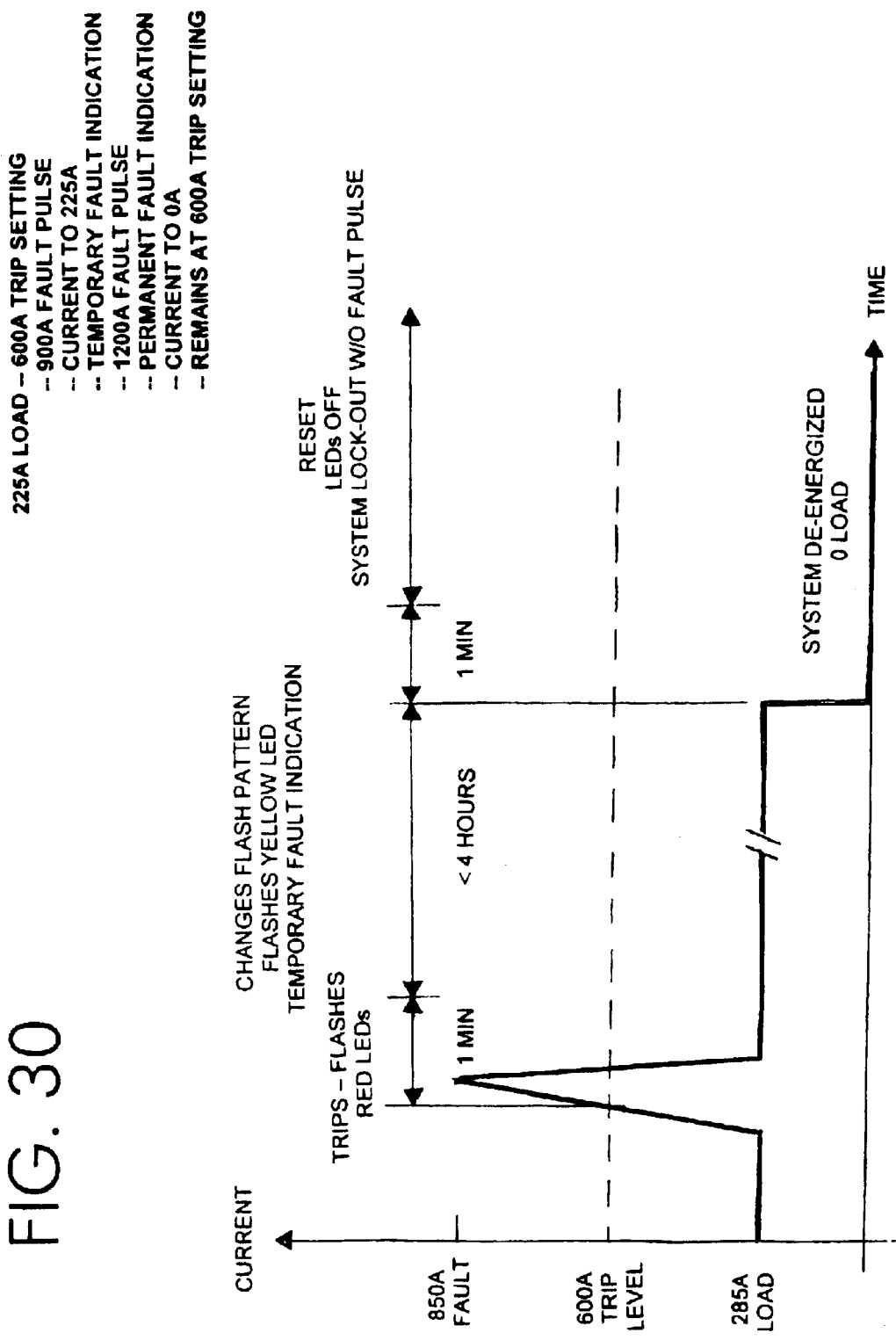
FIG. 30 is a diagrammatic illustration of the response of the fault indicator of the present invention to an 850 A temporary current fault in a monitored conductor when the trip setting is set at 600 A, followed by de-energization of the distribution system.

In FIG. 30, an initial load current of 285 A results in the trip setting to be configured at 600 A. A subsequent fault of 850 A causes the permanent fault LEDs to begin flashing. At the end of one minute, the microcontroller determines that the load current remains at 285 A, so the fault is temporary. The flashing pattern is then changed to that of temporary fault LED 34 toward a timed reset period of four hours. However, before the four hours elapses, the system is de-energized and the load current falls to zero. After one minute, microcontroller 110 determines that there is no load current in conductor 21 and resets the fault indicator, including termination of the flashing of temporary fault LED 34.

Figure 31:
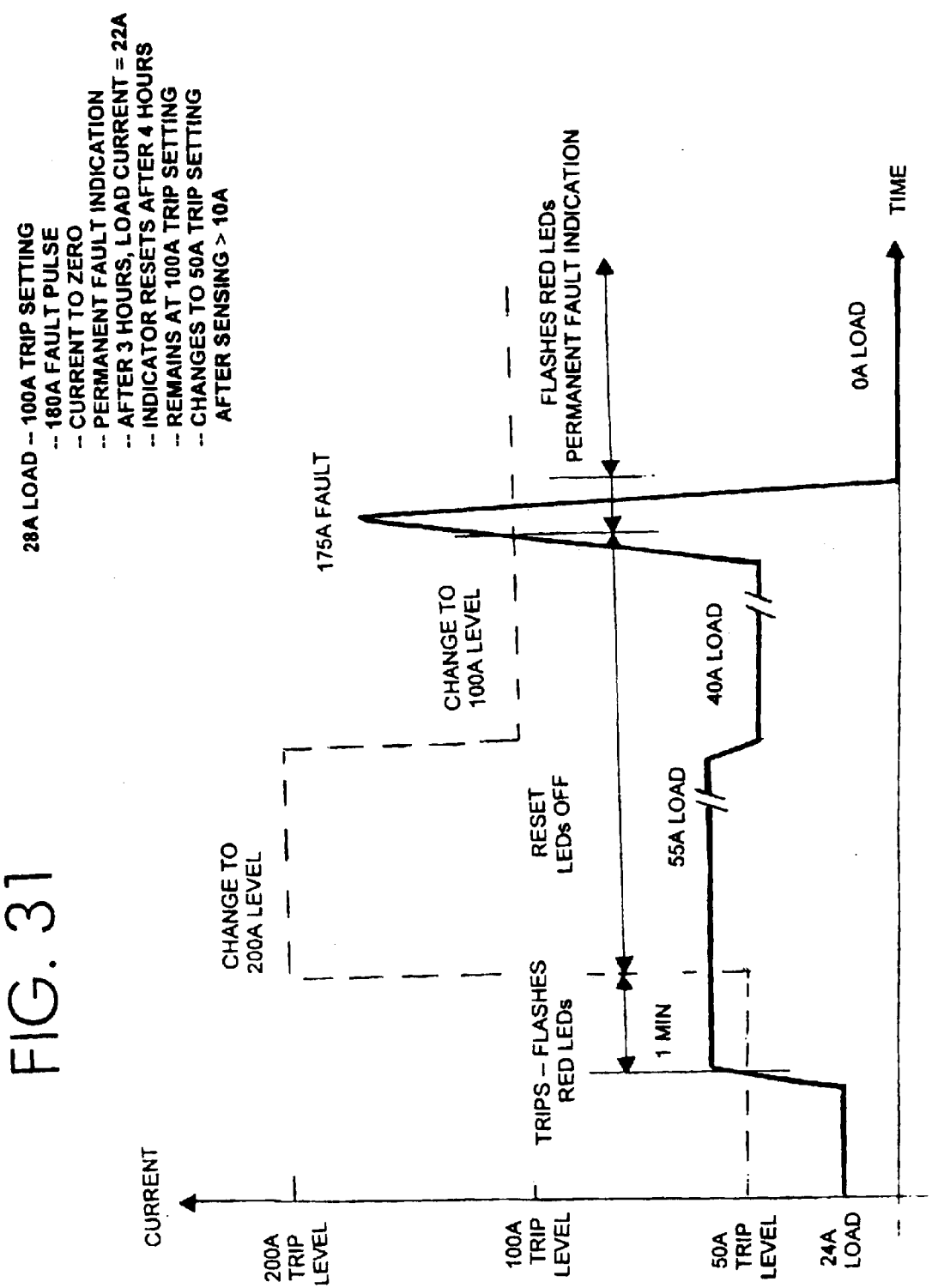
FIG. 31 is a diagrammatic illustration of the response of the fault indicator of the present invention to various changes in load current in a monitored conductor that result in changes in the trip settings, followed by a permanent fault of 175 A when the trip setting is at 100 A.

In FIG. 31, the initial load current of 24 A causes the microcontroller to configure the initial trip setting of 50 A. A later change in load current to 55 A exceeds the 50 A trip setting and microcontroller 110 determines that a permanent fault has occurred. At the end of one minute, the microcontroller determines that the load current remains at 55 A. Accordingly, microcontroller 110 reconfigures the trip setting for 200 A and extinguishes the permanent fault LEDs 33 and 35. Later when the load current drops to 40 A, the microcontroller again reconfigures the trip setting to 100 A. Then, a 175A fault occurs, which exceeds the 100 A trip setting. Microcontroller 110 begins flashing the permanent fault LEDs 33 and 35. At the end of one minute, when the load current is zero, the microcontroller confirms that a permanent fault has occurred and the permanent fault LEDs continue to flash for the duration of the timed reset period.

Figure 32:
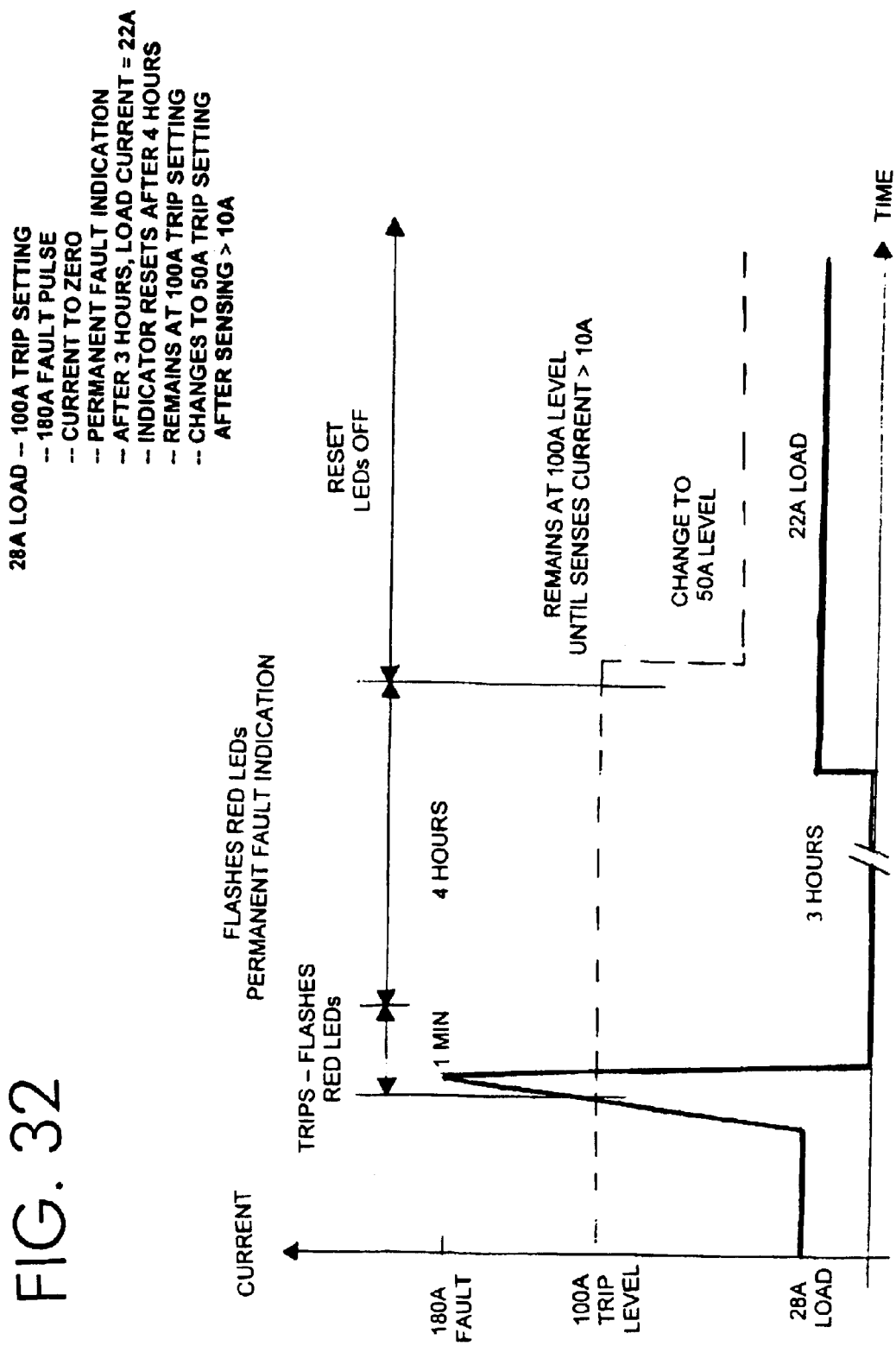
FIG. 32 is a diagrammatic illustration of the response of the fault indicator of the present invention to a 180 A current fault in a monitored conductor when the trip setting is set at 100 A, followed by re-energization of the monitored conductor before the fault indicator times out its reset at 4 hours.

In FIG. 32, microcontroller 110 configures the trip setting at 100 A in response to an initial load current of 28 A. Later, a 180 A fault exceeds the trip setting, and the microcontroller activates the flashing pattern of permanent fault LEDs 233 and 35. At the end of one minute, the load current is zero and microcontroller 110 determines that the fault is permanent. Thus, the permanent fault LEDs continue to flash toward the four hour timed reset period. Before the end of the four-hour period, power is restored to conductor at a load of 22 A. However, fault indicator 20 continues to flash the permanent fault LEDs indicating that a permanent fault occurred within the last four hours, despite restoration of power during the meantime. At the end of four hours of timed reset, fault indicator 20 is reset and resumes normal operation. At this time, microcontroller 110 determines that the load current is 22 A, resulting in the trip setting being reconfigured at 50 A.

while particular embodiments of the invention have been shown and described, it will be obvious to those skilled in the art that changes and modifications may be made therein without departing from the invention in its broader aspects.

What is claimed is:

1. A fault indicator for indicating the occurrence of a fault in an electrical conductor, said fault indicator comprising:
   a housing;
   a battery;
   a display for indicating that a fault condition has occurred;
   a current sensor for sensing a known load current in said conductor, and for providing a load current signal that represents the load current;
   a microcontroller that is in communication with said load current signal from said current sensor to determine the load current in said conductor; that selects a trip setting from a plurality of trip settings that is related to the known load current in said conductor, and that calibrates the selected trip setting.

2. The fault indicator as claimed in accordance with claim 1, said fault indicator further comprising:
   a memory that is accessed by said microcontroller, whereby said microcontroller stores calibration information for the selected trip setting in said memory.

3. The fault indicator as claimed in accordance with claim 1 wherein said microcontroller determines the load current in said conductor for others of the plurality of trip settings for known load currents associated with each trip setting, and calibrates each of the other trip settings.

4. The fault indicator as claimed in accordance with claim 2, wherein said microcontroller stores calibration information for each of the other selected trip settings in said memory.

5. The fault indicator as claimed in accordance with claim 1, wherein said display is an illuminated display and said microcontoller flashes the illuminated display in a distinctive pattern to confirm that calibration of the plurality of trip settings is completed.

6. The fault indicator as claimed in accordance with claim 5, wherein said microcontroller flashes the illuminated display once for the first trip setting and twice for the second trip setting of said plurality of trip settings to confirm that calibration of the first and second trip settings is completed.

7. The fault indicator as claimed in accordance with claim 6, wherein said plurality of trip settings consists of n settings and wherein said microcontroller flashes the illuminated display n times to confirm that calibration of the nth trip setting is completed.

8. The fault indicator as claimed in accordance with claim 7, wherein said illuminated display is of the light emitting diode (LED) type.

9. The fault indicator as claimed in accordance with claim 8 wherein said trip settings are selected from the group consisting of 25, 50, 100, 200, 400, 600, 800, 1000, 1200 and 2500 amperes.

10. The fault indicator as claimed in accordance with claim 1 wherein said plurality of trip settings are selected in the range of about 50 amperes to about 1200 amperes.

11. A method of automatically calibrating a plurality of trip settings in a fault indicator that detects faults in a monitored electrical conductor, wherein said fault indicator includes a housing, a battery, a display for displaying a fault condition, a current sensor and a microcontroller, said method comprising the steps of:
   selecting one of the plurality of trip settings to be calibrated;
   sensing a known load current associated with the selected trip setting in said conductor with the current sensor;
   providing a load current signal from the current sensor that represents the known load current in the conductor;
   determining the load current in said conductor based upon the load current signal; and
   calibrating said one trip setting to the known load current.

12. The method of automatically configuring a fault indicator in accordance with claim 11, wherein the fault indicator further includes a memory, said method further comprising the additional step of:
   storing information from the calibration step for the selected trip setting in said memory.

13. The method of automatically configuring a fault indicator in accordance with claim 11, said method further comprising the additional step of:
   sequentially calibrating each of the plurality of trip settings.

14. The method of automatically configuring a fault indicator in accordance with claim 13, wherein the fault indicator further includes a memory, said method further comprising the additional step of:
   storing information from the calibration step for each of the plurality of trip settings in said memory.

15. The method of automatically configuring a fault indicator in accordance with claim 13, wherein said display is an illuminated display, said method further comprising the additional step of:
   flashing said illuminated display in a distinctive pattern that confirms that calibration of each of said plurality of trip levels is completed.

16. The method of automatically configuring a fault indicator in accordance with claim 11, wherein said display is an illuminated display, said method further comprising the additional step of:
   flashing said illuminated display to confirm that calibration of said one trip level is completed.

* * * * *